United States Patent
Ohta et al.

(10) Patent No.: US 11,243,118 B2
(45) Date of Patent: Feb. 8, 2022

(54) ELECTROMAGNETIC WAVE SENSOR

(71) Applicant: TDK Corporation, Tokyo (JP)

(72) Inventors: Naoki Ohta, Tokyo (JP); Shinji Hara, Tokyo (JP); Susumu Aoki, Tokyo (JP); Eiji Komura, Tokyo (JP); Akimasa Kaizu, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/976,110

(22) PCT Filed: Mar. 7, 2018

(86) PCT No.: PCT/JP2018/008736
§ 371 (c)(1),
(2) Date: Aug. 27, 2020

(87) PCT Pub. No.: WO2019/171488
PCT Pub. Date: Sep. 12, 2019

(65) Prior Publication Data
US 2020/0408604 A1  Dec. 31, 2020

(51) Int. Cl.
*G01J 5/22* (2006.01)
*G01J 1/02* (2006.01)
(Continued)

(52) U.S. Cl.
CPC . *G01J 5/22* (2013.01); *G01J 1/02* (2013.01); *G01J 5/0809* (2013.01); *G01J 5/0831* (2013.01); *H01L 27/14649* (2013.01)

(58) Field of Classification Search
CPC .... G01J 5/22; G01J 1/02; G01J 5/0809; G01J 5/0831; G01J 5/06; G01J 5/20; H01L 27/14649
(Continued)

(56) References Cited

U.S. PATENT DOCUMENTS

2003/0183921 A1   10/2003   Komobuchi et al.
2011/0155914 A1    6/2011   Ohhira et al.
(Continued)

FOREIGN PATENT DOCUMENTS

JP   2000-065637 A    3/2000
JP   2000-337959 A   12/2000
(Continued)

OTHER PUBLICATIONS

International Search Report of the International Searching Authority dated May 22, 2018 for the corresponding International application No. PCT/JP2018/008736 (and English translation).

*Primary Examiner* — David P Porta
*Assistant Examiner* — Gisselle M Gutierrez
(74) *Attorney, Agent, or Firm* — Posz Law Group, PLC

(57) ABSTRACT

An electromagnetic wave sensor that limits the influence on bolometer membranes that is caused by heat from a local heat source is provided. Electromagnetic wave sensor has first substrate, second substrate that faces first substrate so as to form inner space between first substrate and second substrate, wherein second substrate transmits infrared rays; a plurality of bolometer membranes that is provided in inner space and that is supported by second substrate; local heat source that is formed in first substrate; first electric connection member that connects first substrate to second substrate; and lead that extends on or in second substrate and that connects first electric connection member to bolometer membrane.

22 Claims, 17 Drawing Sheets

(51) Int. Cl.
*G01J 5/08* (2006.01)
*H01L 27/146* (2006.01)

(58) Field of Classification Search
USPC ..................................................... 250/338.1
See application file for complete search history.

(56) References Cited

U.S. PATENT DOCUMENTS

| | | |
|---|---|---|
| 2012/0307030 A1 | 12/2012 | Blanquart |
| 2013/0126707 A1 | 5/2013 | Blanquart |
| 2013/0126708 A1 | 5/2013 | Blanquart |
| 2013/0126709 A1 | 5/2013 | Blanquart |
| 2013/0284885 A1 | 10/2013 | Chen et al. |
| 2014/0306312 A1 | 10/2014 | Han et al. |
| 2014/0374596 A1 | 12/2014 | Tari et al. |
| 2015/0215560 A1 | 7/2015 | Blanquart |
| 2016/0155765 A1 | 6/2016 | Blanquart |
| 2016/0190197 A1 | 6/2016 | Blanquart |
| 2016/0256041 A1 | 9/2016 | Blanquart et al. |
| 2016/0307944 A1 | 10/2016 | Chen et al. |
| 2017/0221945 A1 | 8/2017 | Blanquart |
| 2018/0000333 A1 | 1/2018 | Blanquart |
| 2018/0192861 A1 | 7/2018 | Blanquart |
| 2019/0008375 A1 | 1/2019 | Blanquart et al. |
| 2020/0129054 A1 | 4/2020 | Blanquart |
| 2020/0146542 A1 | 5/2020 | Blanquart |

FOREIGN PATENT DOCUMENTS

| | | | |
|---|---|---|---|
| JP | 2003-100919 | A | 4/2003 |
| JP | 2003-337066 | A | 11/2003 |
| JP | 2007-309877 | A | 11/2007 |
| JP | 2010-127892 | A | 6/2010 |
| JP | 2011-137744 | A | 7/2011 |
| JP | 2013-152115 | A | 8/2013 |
| JP | 2013-232646 | A | 11/2013 |
| JP | 2014-514891 | A | 6/2014 |
| JP | 5923617 | B2 | 5/2016 |
| KR | 20140128973 | A | 11/2014 |

# ELECTROMAGNETIC WAVE SENSOR

CROSS REFERENCE TO RELATED APPLICATION

This application is a U.S. national stage application of International Application No. PCT/JP2018/008736 filed on Mar. 7, 2018, the contents of which are incorporated herein by reference.

FIELD OF THE INVENTION

The present invention relates to an electromagnetic wave sensor, particularly to an infrared sensor having bolometer membranes.

BACKGROUND OF THE INVENTION

An infrared sensor is known that comprises bolometer membranes and that detects the temperature distribution of an object in the wavelength region of infrared. In such an infrared sensor, a temperature change occurs in bolometer membranes due to infrared rays that enter the bolometer membranes from outside and that is absorbed by the bolometer membranes, and the temperature change of the bolometer membranes is outputted as a change of resistance. There is a correlation (Stefan-Boltzmann's law) between the temperature of an object and emissivity (radiant energy) of the radiation from the object. Therefore, the temperature distribution of an object can be measured by detecting a temperature change of the bolometer membranes due to radiant heat that is emitted from the object.

From the foregoing, it is necessary for an infrared sensor having bolometer membranes to eliminate the influence of heat other than radiant heat as much as possible. For this reason, in order to limit the influence of convection, the bolometer membranes are generally installed in a vacuum housing having a window through which infrared rays are transmitted. In addition, an infrared sensor having bolometer membranes is provided with an element, such as an ROIC (Read Out Integrated Circuit) that converts a change of resistance of the bolometer membranes to an electric signal. Such an element, which works as a local heat source, may significantly affect the measurement of the bolometer membranes. That is, an infrared camera that is equipped with an infrared sensor may capture such a local heat source in the image.

JP 5923617B discloses a MEMS sensor in which an ROIC is formed on a first wafer and micro bolometers are supported by a second wafer. The micro bolometers are supported by the second wafer via meandering leads, and the surface of the second wafer that faces the micro bolometers is concave. The micro bolometers are thereby arranged such that they float in the space between the first wafer and the second wafer. The ROIC and the micro bolometers are electrically connected by solder members that extend between the first wafer and the second wafer in a direction perpendicular to the wafers.

SUMMARY OF THE INVENTION

The MEMS sensor that is disclosed in JP 59236176 can limit the influence of heat that is caused by the ROIC because the ROIC, which is a local heat source, and the micro bolometers are arranged on different wafers (substrates). However, since the heat from the ROIC is transmitted to the second wafer through the soldering members and is further transmitted to the micro bolometers by the leads, it is still difficult to sufficiently limit the influence of the heat from the ROIC.

The present invention aims at providing an electromagnetic wave sensor that limits the influence on bolometer membranes that is caused by heat from a local heat source.

An electromagnetic wave sensor of the present invention comprises: a first substrate, a second substrate that faces the first substrate so as to form an inner space between the first substrate and the second substrate, wherein the second substrate transmits infrared rays; a plurality of bolometer membranes that is provided in the inner space and that is supported by the second substrate; a local heat source that is formed in the first substrate; a first electric connection member that connects the first substrate to the second substrate; and a lead that extends on or in the second substrate and that connects the first electric connection member to the bolometer membrane.

The lead extends on or in the second substrate. In other words, the lead is in physical contact with the second substrate along the path of the lead. Heat that is transmitted from the local heat source to the lead via the first electric connection member diffuses into the second substrate through the physical contact portion along the path. That is, since the second substrate functions as a heat absorber that absorbs the heat of the lead, the influence on a bolometer membrane that is caused by heat from a local heat source can be limited.

The above and other objects, features and advantages of the present invention will become apparent from the following description with reference to the accompanying drawings which illustrate examples of the present invention.

Figure 1:
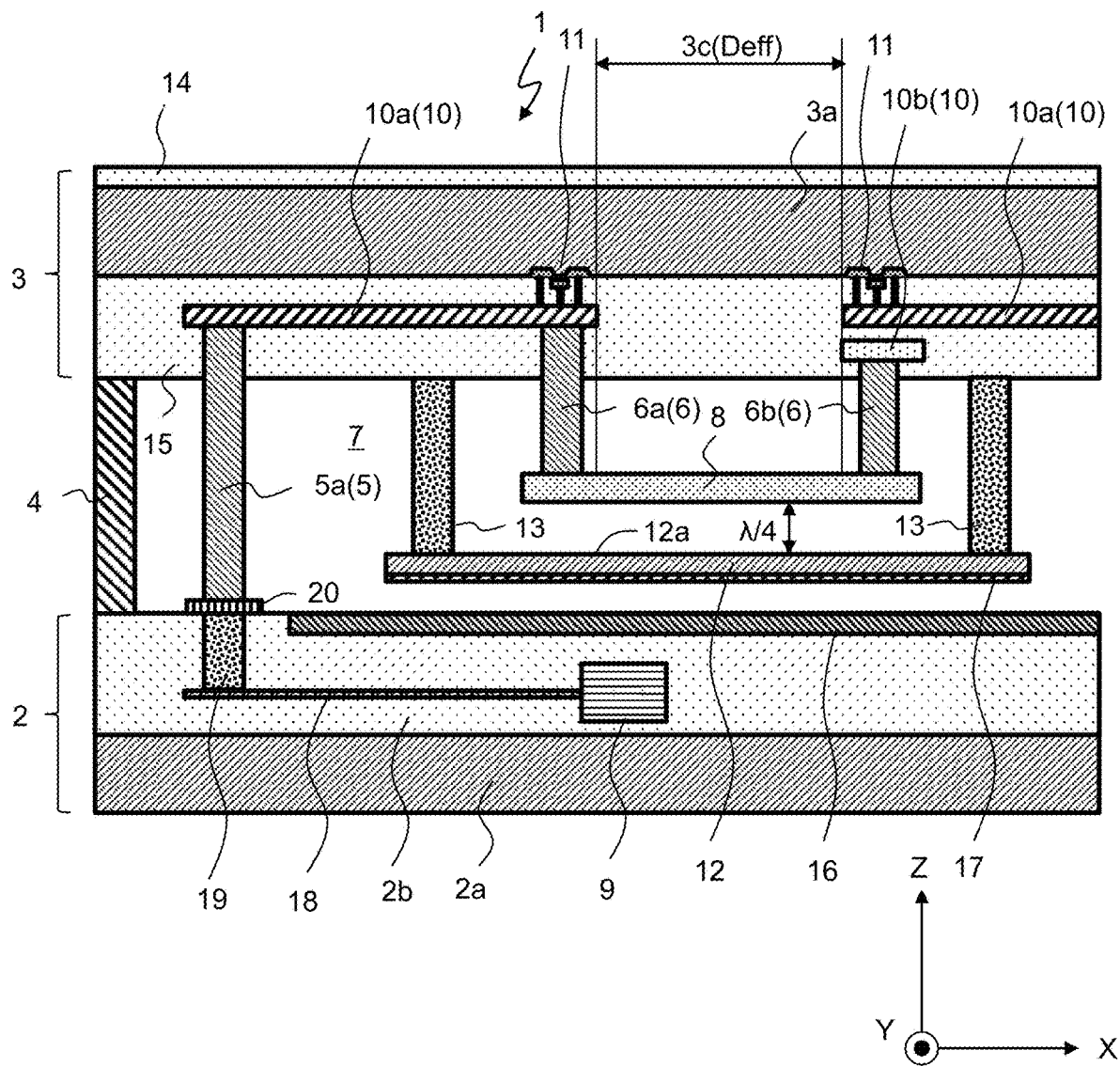
FIG. 1 is a schematic side view of an infrared sensor of a first embodiment of the present invention.

LIST OF REFERENCE NUMERALS 1 infrared sensor (electromagnetic wave sensor)
2 first substrate
3 second substrate
4 side wall
5 first electric connection member
5a first row electric connection member
5b first column electric connection member
6 second electric connection member
6a second row electric connection member
6b second column electric connection member
7 inner space
8 bolometer membrane
9 local heat source
10 lead
10a row lead
10b column lead
11 selective transistor
12 radiation shield
13 support member
14 first anti-reflective film
15 second anti-reflective film
16 heat diffusing plate
17 getter film
21 reflection film
31 filter film
41 first convex region
43 second convex region
51 blind cell
53 infrared shield
61 capacitor
X first direction
Y second direction
Z third direction

DETAILED DESCRIPTION OF THE EMBODIMENTS

Hereinafter, various embodiments of the electromagnetic wave sensor of the present invention will be described with reference to the drawings. In the following descriptions and drawings, first direction X and second direction Y are parallel to the main surfaces of first substrate 2 and second substrate 3. First direction X corresponds to the rows of the array of bolometer membranes 8, and second direction Y corresponds to the columns of the array of bolometer membranes 8. Third direction Z is perpendicular both to first direction X and to second direction Y, and is perpendicular to the main surfaces of first substrate 2 and second substrate 3.

The following embodiments are directed to an infrared sensor in which a plurality of bolometer membranes is arranged to form a two-dimensional array. Such an infrared sensor is mainly used as an image sensor of an infrared camera. An infrared camera may be used for a night vision scope or a night vision goggle in the dark, and may also be used to measure the temperature of a man or an object. Furthermore, an infrared sensor in which a plurality of bolometer membranes is arranged in one dimension may be used as a sensor that measures various kinds of temperature or temperature distribution. Although explanation is omitted, an infrared sensor in which a plurality of bolometer membranes is arranged in one dimension is also included in the scope of the present invention. Furthermore, the electromagnetic wave that is detected is not limited to infrared, and the electromagnetic wave sensor of the present invention may be a sensor that detects, for example, terahertz waves having a wave length of 100 μm to 1 mm.

First Embodiment

Figure 2:
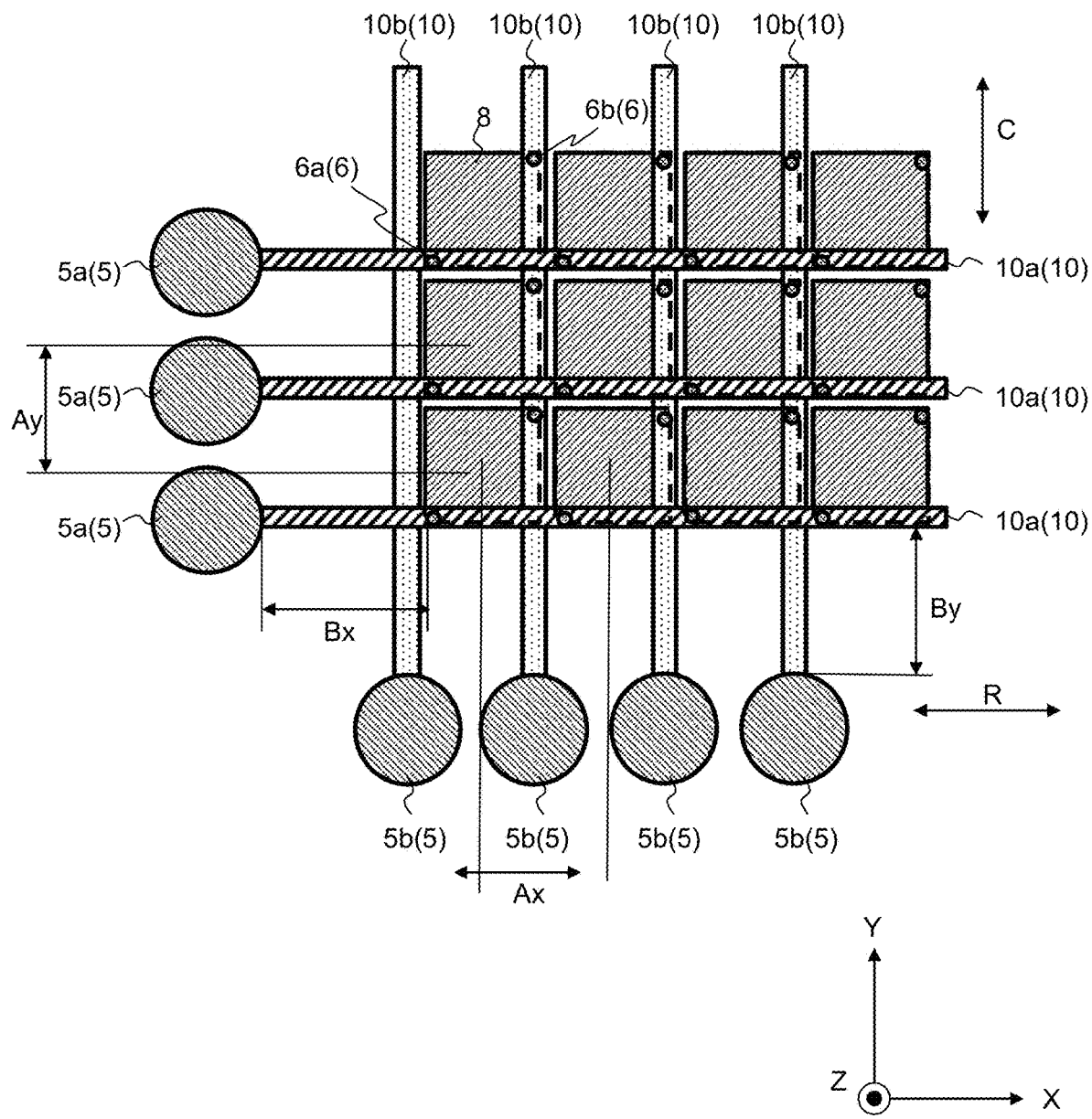
FIG. 2 is a schematic plan view of the infrared sensor, as viewed from above in the Z direction in FIG. 1.
Figure 3:
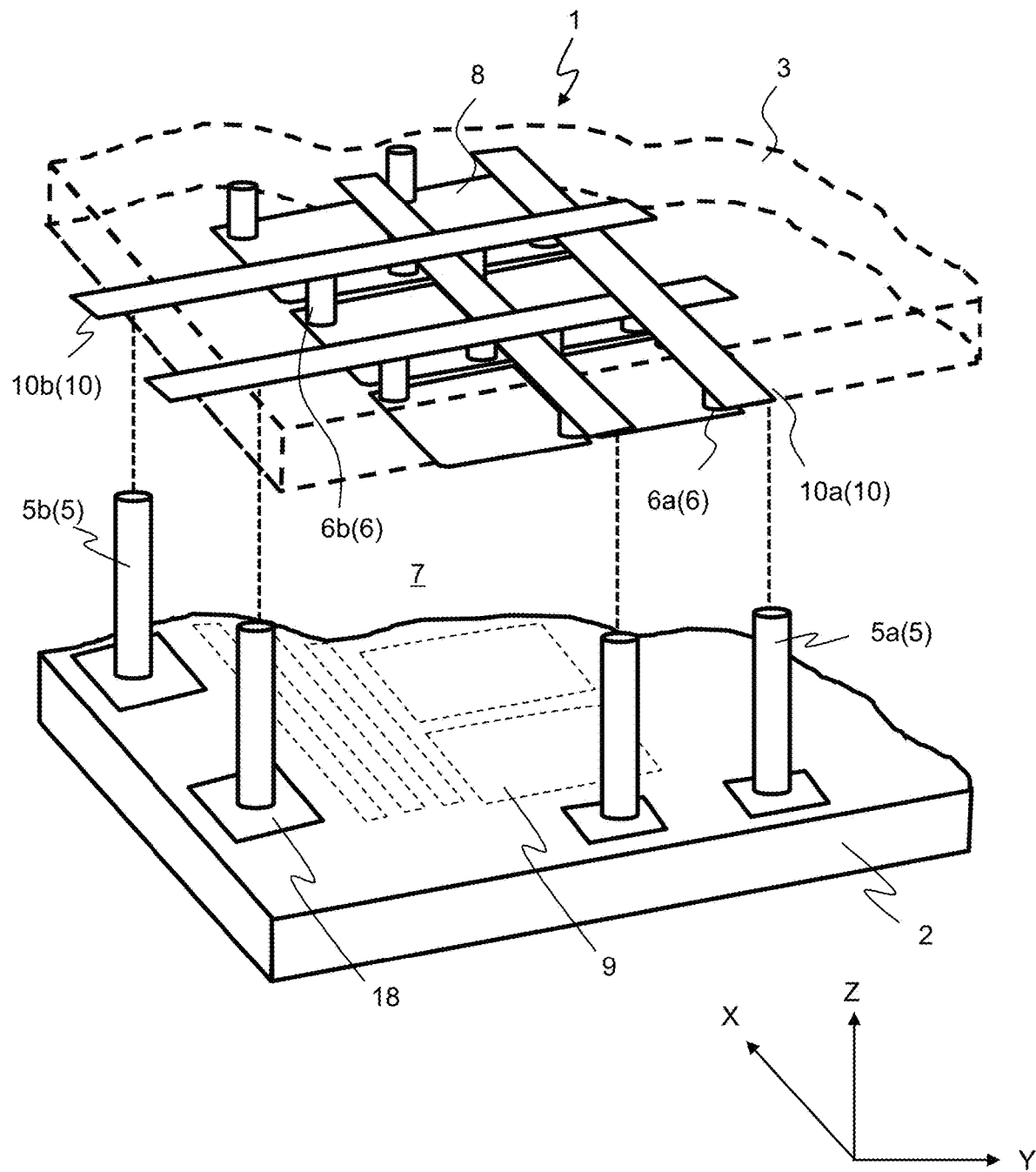
FIG. 3 is a perspective view of the infrared sensor shown in FIG. 1.

FIG. 1 is a schematic side view of infrared sensor 1 of the first embodiment of the present invention, and FIG. 2 is a plan view of infrared sensor 1 in FIG. 1, as viewed from above in the Z direction, only illustrating bolometer membranes 8, leads 10 and first and second electric connection members 5, 6. FIG. 3 shows a perspective broken view of infrared sensor 1 in FIG. 1, in which first substrate 2 and second substrate 3 are shown such that they are spaced apart. Infrared sensor 1 has first substrate 2, second substrate 3 that faces first substrate 2, as well as side walls 4 that connect first substrate 2 and second substrate 3. First substrate 2, second substrate 3 and side walls 4 form tightly closed inner space 7, which is at a negative pressure or forms a vacuum. As a result, convection of gas in inner space 7 can be prevented or limited, and thermal influence on bolometer membranes 8 can be reduced. Inner space 7 may also be at an atmospheric pressure. The thermal influence on bolometer membranes 8 is increased in this case, but the effect of the present invention can be obtained.

First substrate 2 has silicon substrate 2a and insulating film 2b, and various elements and circuits are formed on the surface of silicon substrate 2a or in insulating film 2b. Second substrate 3 has silicon substrate 3a and first and second anti-reflective films 14, 15 that cover both sides of silicon substrate 3a. Since second substrate 3 functions as a window substrate that allows long-wavelength infrared rays to pass through, a germanium substrate and the like may be used instead of silicon substrate 3a, but for reasons described later, silicon substrate 3a is more preferably used. The wave length of the long-wavelength infrared is approximately 8-14 μm.

A plurality of generally square-shaped bolometer membranes 8 is provided in inner space 7. Bolometer membranes 8 form a two-dimensional grid array that consists of a plurality of rows R along which bolometer membranes 8 are arranged at constant interval Ax in first direction X and a plurality of columns C along which bolometer membranes 8 are arranged at constant interval Ay in a direction that intersects first direction X, preferably in second direction Y that is perpendicular to first direction X. Each bolometer membrane 8 constitutes one cell or one pixel in the array. Examples of the number of the rows and columns include, but are not limited to, 640 rows×480 columns, 1024 rows× 768 columns, etc. Bolometer membrane 8 has a silicon substrate and a film, made of vanadium oxide (VOx) or amorphous silicon (a-Si), that is formed on the silicon substrate. Bolometer membrane 8 further includes getter film 17 that maintains the degree of vacuum in inner space 7.

In first substrate 2, elements, such as an ROIC, a regulator, an A/D converter and a multiplexer, are formed. The ROIC is an integrated circuit that converts the change of resistance of bolometer membranes 8 to electric signals. These elements are local heat sources 9 that are provided at predetermined positions of first substrate 2. First substrate 2 and second substrate 3 are connected by first electric connection members 5. These elements are connected to first electric connection members 5 via inner circuit 18 of first substrate 2, conductive paths 19 that are connected to inner circuit 18 and terminals 20 that are connected to conductive paths 19.

First electric connection member 5 is a pillar-shaped conductor having a circular cross section, and may be formed, for example, by plating. Since first electric connection member 5 has a larger dimension (height) in the Z direction than second electric connection member 6, described later, first electric connection member 5 has a larger cross section than second electric connection member 6 for manufacturability. First electric connection members 5 consist of first row electric connection members 5a that are connected to row leads 10a, described later, in second substrate 3 and first column electric connection members 5b that are connected to column leads 10b, described later, in second substrate 3. As shown in FIG. 2, first row electric connection members 5a are concentrated on one end of rows R of bolometer membranes 8, and first column electric connection members 5b are concentrated on one end of columns C of bolometer membranes 8.

Each bolometer membrane 8 is supported by second substrate 3 via a pair of second electric connection members 6. Second electric connection member 6 is also a pillar-shaped conductor having a circular cross section, and may be formed, for example, by plating. A pair of second electric connection members 6 consists of second row electric connection member 6a that is connected to row lead 10a and second column electric connection member 6b that is connected to column lead 10b. Second row electric connection member 6a and second column electric connection member 6b extend downward in the Z direction toward first substrate 2 from row lead 10a and column lead 10b, respectively, and terminate between first substrate 2 and second substrate 3. Therefore, bolometer membrane 8 is suspended in inner space 7 while being spaced in the Z direction both from first substrate 2 and second substrate 3. Bolometer membrane 8 is supported by second row electric connection member 6a and second column electric connection member 6b at two corners on a diagonal line of bolometer membrane 8. Second electric connection members 6 support bolometer membrane 8 and provide a sense current to bolometer membrane 8.

Second substrate 3 is formed with leads 10 that connect first electric connection members 5 to bolometer membranes 8 and that supply a sense current to bolometer membranes 8. Lead 10 is made of a conductor, such as copper. Leads 10 are formed in a grid pattern and are provided for respective rows R and columns C of bolometer membranes 8. That is, leads 10 consist of row leads 10a that extend in the row direction (the first direction X) and column leads 10b that extend in the column direction (the second direction Y). Line lead 10a connects first row electric connection member 5a to second row electric connection member 6a, and column lead 10b connects first column electric connection member 5b to second column electric connection member 6b. Line leads 10a sequentially connect bolometer membranes 8 that are included in the corresponding rows R, and column leads 10b sequentially connect bolometer membranes 8 that are included in the corresponding columns C. For convenience, row lead 10a is divided where row lead 10a faces bolometer membrane 8 in FIG. 1, but as shown in FIGS. 2 and 3, row lead 10a extends continuously. The same applies to column lead 10b.

Lead 10 extends between adjacent bolometer membranes 8. As a result, interference between leads 10 and bolometer membranes 8 can be avoided, and the influence on bolometer membranes 8 due to leads 10 being heated by the radiant heat of infrared rays can be limited. Line leads 10a and column leads 10b extend at different positions in the Z direction with insulating film 152 (see FIG. 4) interposed therebetween, so that they cross each other without being electrically connected. In the present embodiment, row leads 10a extend above column leads 10b, i.e. at a position closer to second substrate 3 in the Z direction, but row leads 10a may be positioned below column leads 10b. In addition, since silicon substrate 3a has some conductivity, silicon substrate 3a and row leads 10a are also insulated from each other by insulating film 151 (see FIG. 4). These insulating films 151, 152 form a part of second anti-reflective film 15, as will be described later.

Wire length Bx of row lead 10a between first row electric connection member 5a and bolometer membrane 8 that is the closest to first row electric connection member 5a is longer than distance Ax at which bolometer membranes 8 are arranged in first direction X. Similarly, wire length By of column lead 10b between first column electric connection member 5b and bolometer membrane 8 that is the closest to first column electric connection member 5b is longer than distance Ay at which bolometer membranes 8 are arranged in second direction Y. Here, wire length Bx or By is not the linear distance between bolometer membrane 8 and first row electric connection member 5a or between bolometer membrane 8 and first column electric connection member 5b, but the length along the path of row lead 10a or column lead 10b, that is, the length of the center line of row lead 10a or column lead 10b. Leads 10 extend linearly in first direction X and in second direction Y in the illustrated embodiment, but they may extend in a serpentine or meandering shape in order to ensure wire length Bx, By.

A plurality of selective transistors 11 that select one bolometer membrane 8 from a plurality of bolometer membranes 8 is formed on silicon substrate 3a of second substrate 3. Selective transistors 11 correspond to respective bolometer membranes 8. Selective transistors 11 are disposed such that selective transistors 11 avoid regions (hereinafter, referred to as window region 3c) of second substrate 3 where bolometer membranes 8 face second substrate 3. As a result, diffuse reflection of infrared rays and a reduction in the efficiency of incidence of infrared rays can be prevented. The reason why second substrate 3 has silicon substrate 3a is not only that silicon substrate 3a transmits infrared rays. It should be noted that selective transistors 11 can be formed in second substrate 3 by providing second substrate 3 with silicon substrate 3a.

At least a part of, preferably the entire part of, the outer surface of second substrate 3 is made of first anti-reflective film 14. Here, the outer surface of second substrate 3 refers to the plane that extends in the X-Y plane including window regions 3c of second substrate 3, but does not include the side surfaces of second substrate 3. The inner surface of second substrate 3 is made of second anti-reflective film 15. Here, the inner surface of second substrate 3 is a surface that is in contact with inner space 7 of second substrate 3. In other words, the outer surface and the inner surface of silicon substrate 3a are covered with first anti-reflective film 14 and second anti-reflective film 15, respectively. First anti-reflective film 14 prevents or limits the reflection of the incident light and improves the efficiency of incidence of infrared rays. Second anti-reflective film 15 prevents infrared rays that have passed through second substrate 3 from being reflected by the inner surface of second substrate 3, and allows infrared rays to smoothly enter bolometer membranes 8. Both first anti-reflective film 14 and second anti-reflective film 15 are laminated films in which layers having different refractive indices are alternately stacked, and these layers reduce the reflectance of light in a particular wave length region by using interferences of waves that are reflected by the layers. First anti-reflective film 14 and second anti-reflective film 15 are laminated films made of insulating films, which are formed by stacking, for example, an oxide film, a nitride film, a sulfide film, a fluoride film, a boride film, a bromide film, a chloride film, a selenide film, a Ge film, a diamond film, a chalcogenide film, a Si film and the like.

Figure 4:
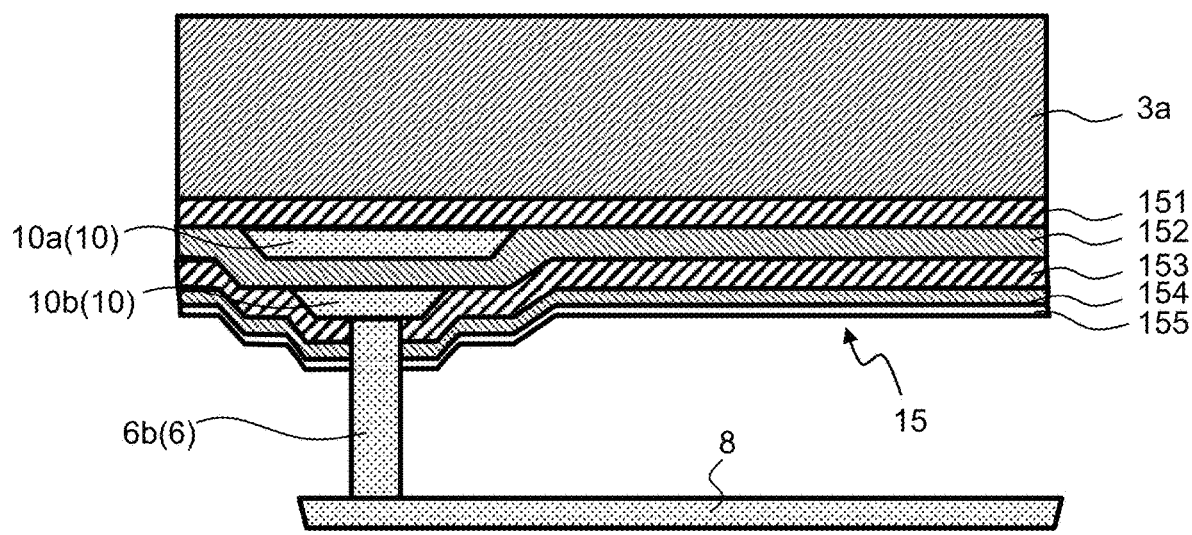
FIG. 4 is a schematic sectional view of the second anti-reflective film.

FIG. 4 is a schematic sectional view of second anti-reflective film 15. Line leads 10a and column leads 10b are embedded in second anti-reflective film 15. Second anti-reflective film 15 consists of insulating layers 151-155. Line leads 10a are embedded between insulating layer 151 and insulating layer 152, and column leads 10b are embedded between insulating layer 152 and insulating layer 153. Each insulating layer 151-155 may be made of ZnS, $SiO_2$, AlOx, SiN, AlN, MgF, CaF, Ge, YF, ZnSe, KBr, NaCl, BaF, diamond, chalcogenide, Si and the like. Insulating layers 154, 155 are provided in order to enhance the function of second anti-reflective film 15, and may have a multilayered structure having three or more layers.

Either first anti-reflective film 14 or second anti-reflective film 15 or both may be omitted. Even when second anti-reflective film 15 is omitted, row leads 10a and column leads 10b need to be insulated from each other by an insulating layer. Either row leads 10a or column leads 10b may be exposed to inner space 7. That is, either row leads 10a or column leads 10b may extend inside second substrate 3 and the remaining leads may extend on the surface of second substrate 3.

Radiation shield 12 that attenuates or shields radiation from first substrate 2 is provided between each bolometer membrane 8 and first substrate 2. Radiation shield 12 is supported by a plurality of (for example, four) support members 13 that extend downward in the Z direction from second substrate 3 toward first substrate 2. One end of support member 13 is connected to a corner of radiation shield 12, and the other end thereof is connected to second substrate 3. If support members 13 are made of a material having a low thermal conductivity, then support members 13 may be supported by first substrate 2.

Radiation shield 12 is made of a material having a high reflectance for infrared rays, such as Au, Cu, Al and the like. In order to ensure the structural strength, a film made of $SiO_2$, AlOx, SiN, AlN, MgF, CAF, Ge and the like may be formed on the surface of radiation shield 12 that faces first substrate 2. Surface 12a of radiation shield 12 that faces bolometer membrane 8 reflects infrared rays. A part of infrared rays passes through bolometer membrane 8. Radiation shield 12 reflects the infrared rays that have passed through bolometer membrane 8 and causes the infrared rays to enter bolometer membrane 8 from the back side. As a result, it is possible to improve the efficiency of incidence of infrared rays to bolometer membrane 8. The distance between bolometer membrane 8 and radiation shield 12 is about ¼ of wave length $\lambda$ of the incident infrared rays. Therefore, the interference between the incident infrared rays and the reflected infrared rays can be avoided, and infrared rays can efficiently enter bolometer membrane 8. Since wave length $\lambda$ of infrared rays is approximately 8 to 14 μm, the distance between bolometer membrane 8 and radiation shield 12 is preferably about 2 to 3.5 μm, more preferably about 2.5 to 3.0 μm that maximizes the efficiency of incidence of infrared rays.

Heat diffusing plate 16 is formed on a region of first substrate 2 that faces bolometer membranes 8. Heat diffusing plate 16 is a single continuous metal layer that preferably faces all bolometer membranes 8, and has a higher thermal conductivity than first substrate 2. Heat diffusing plate 16 may be made of a metal having a high thermal conductivity, such as copper. Heat diffusing plate 16 efficiently diffuses heat that is generated from local heat source 9, such as an ROIC, immediately below heat diffusing plate 16 in order to uniformize the temperature distribution of the surface of first substrate 2.

Getter film 17 is formed on the surface of radiation shield 12 that faces first substrate 2. Getter film 17 is made of Ti, TiW, Zn, ZnCo and the like, and adsorbs residual gas in inner space 7 in order to limit the reduction in the degree of vacuum in inner space 7. Getter film 17 may be arranged anywhere in inner space 7, and may also be formed, for example, on heat diffusing plate 16 of first substrate 2.

Infrared rays that enter infrared sensor 1 from window regions 3c of second substrate 3 enters the array of bolometer membranes 8. A sense current sequentially flows through first row electric connection member 5a, row lead 10a, second row electric connection member 6a, bolometer membrane 8 that is selected, second column electric connection member 6b, column lead 10b and first column electric connection member 5b. The change of resistance of the sense current is outputted as a change in voltage, and an electric signal (a voltage signal) is supplied to the ROIC of first substrate 2. The ROIC converts the voltage signal to a brightness temperature. Bolometer membranes 8 are sequentially selected over time by selective transistor 11, and the change of resistance that is outputted from the selected bolometer membrane 8 is sequentially converted to a brightness temperature. In this manner, all bolometer membranes 8 are scanned, and image data for one screen are obtained.

According to infrared sensor 1 of the present embodiment, the influence on bolometer membranes 8 that is caused by the heat that is generated by local heat source 9, such as an ROIC, is limited. First, bolometer membranes 8 are supported by second substrate 3, not by first substrate 2 where local heat sources 9 are provided. The heat transfer path through heat conduction from local heat sources 9 is substantially limited to the path that passes first substrate 2, first electric connection members 5, leads 10 and second electric connection members 6 (heat may be transmitted through side walls 4, but the amount of heat is negligible). Therefore, the heat transfer path is longer than that of a conventional arrangement in which bolometer membranes 8 are supported by first substrate 2, and heat from local heat source 9 is less likely to be transmitted to bolometer membranes 8.

Moreover, in the present embodiment, since leads 10 are in physical contact with second substrate 3 (more precisely, second anti-reflective film 15) over the entire length, the heat that is transmitted through lead 10 diffuses into second substrate 3. The amount of heat that diffuses is positively correlated with the length of lead 10, and the longer lead 10 is, i.e., the longer the length over which lead 10 is in contact with second substrate 3 is, the larger is the amount of heat that diffuses into second substrate 3 and the smaller is the amount of heat that is transmitted to bolometer membrane 8. Bolometer membrane 8 that is the closest to first electric connection member 5 is the most susceptible to thermal influence among the array of bolometer membranes 8, but as described above, wire length Bx (By) between the membrane and first electric connection member 5 is longer than distance Ax (Ay) at which bolometer membranes 8 are arranged. Therefore, the influence of thermal conduction is limited even in bolometer membrane 8 that is the closest to first electric connection member 5. In addition, it is not necessary for leads 10 to be in physical contact with second substrate 3 over the entire length, and leads 10 may be in physical contact with second substrate 3 at least in the section between bolometer membrane 8 that is the closest to first electric connection member 5 (i.e., the most thermally sensitive) and first electric connection member 5.

It should be noted that second substrate 3 is substantially uniformly heated by the radiant heat of infrared (and by visible lights in a bright place). The influence of the radiant heat that heats the entire part of second substrate 3 can be easily treated as background noise. What is problematic in infrared sensor 1 is the phenomenon in which some of bolometer membranes 8 become locally hot relative to the other bolometer membranes 8 due to local heat source 9. However, as described above, according to infrared sensor 1 of the present embodiment, such influence that is caused by local heating is effectively mitigated. In addition, since selective transistors 11 that are arranged in second substrate 3 are mounted in a wide area and are sequentially driven, selective transistors 11 do not have properties as local heat sources, and since only a sense current flows in selective transistors 11, the amount of heat that is generated in selective transistors 11 is slight. Thus, thermal influence on bolometer membranes 8 that is caused by selective transistors 11 is almost negligible.

Further, in the present embodiment, radiation shield 12 is provided between bolometer membrane 8 and first substrate 2. Radiation shield 12 shields the radiant heat that is generated by local heat source 9 and reduces the influence on bolometer membrane 8 by the radiant heat. In addition, since the temperature in the region of first substrate 2 that faces the array of bolometer membranes 8 is uniformized by heat diffusing plate 16, the influence of local heat source 9 is further reduced.

In the present embodiment, bolometer membranes 8 are suspended in inner space 7 by second electric connection members 6. However, as described above, since the heat transfer path from first substrate 2 to bolometer membrane 8 is long in the present embodiment, second electric connection members 6 may be omitted. In this case, bolometer membranes 8 are supported on and in direct contact with second substrate 3.

Second Embodiment

Figure 5:
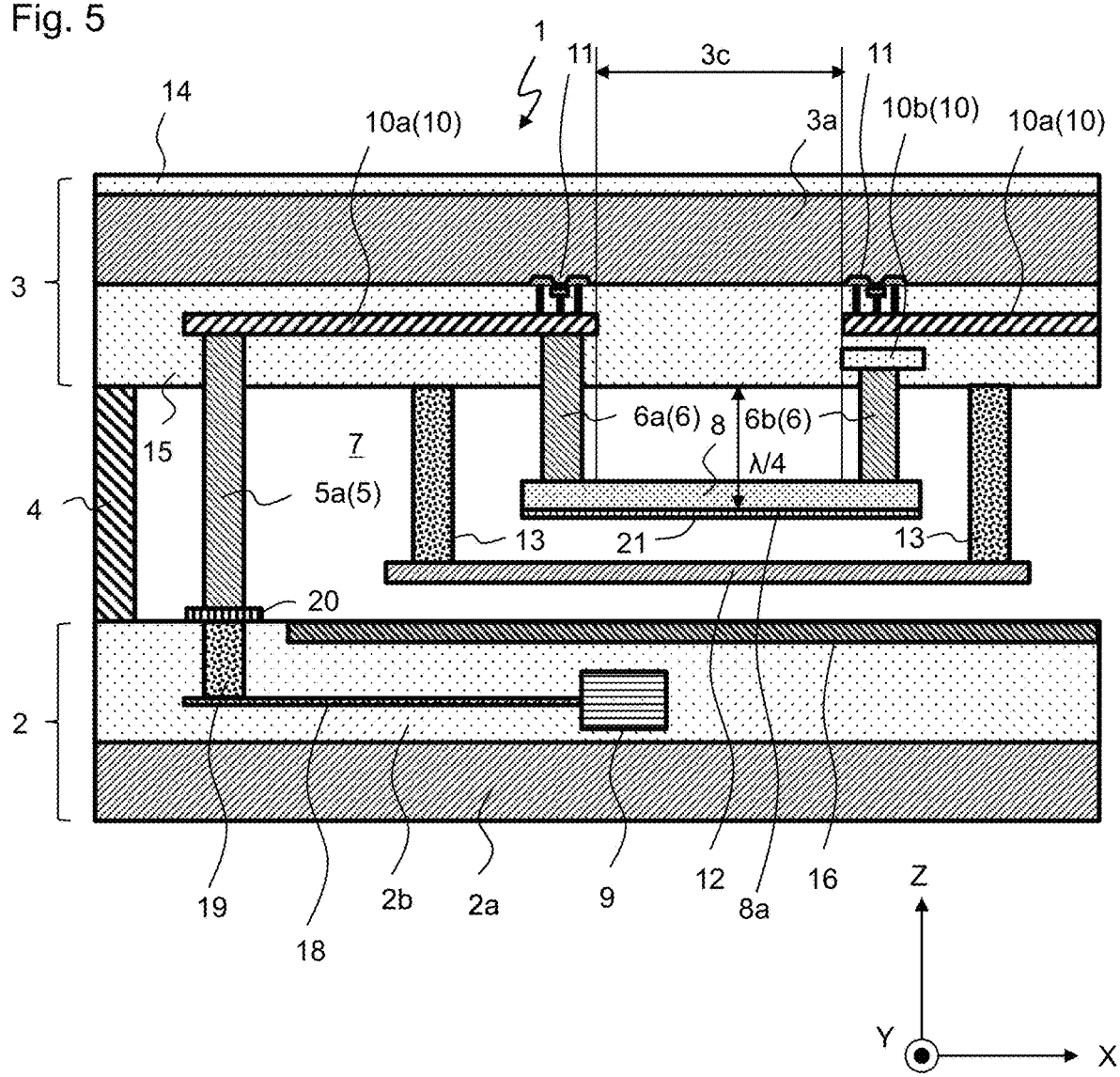
FIG. 5 is a schematic side view of an infrared sensor of a second embodiment of the present invention.

FIG. 5 is a schematic side view of infrared sensor 1 of the second embodiment of the present invention. Here, the difference from the first embodiment will be mainly described. Configurations and effects that are not explained are the same as those of the first embodiment. Infrared sensor 1 has reflection film 21 that is formed on surface 8a of bolometer membrane 8 that faces first substrate 2. Infrared rays that enter from window regions 3c of second substrate 3 is absorbed by bolometer membranes 8, but part of the infrared rays passes through bolometer membranes 8. Reflection film 21 reflects the infrared rays that have passed bolometer membranes 8 and causes the infrared rays to enter bolometer membranes 8 from the back side. As a result, the efficiency of incidence of infrared rays can be improved. The distance between reflection film 21 and second substrate 3 is preferably about ¼ of wave length λ of the incident infrared rays, that is, about 2 to 3.5 µm, and more preferably about 2.5 to 3.0 µm that maximizes the efficiency of incidence of infrared rays. Therefore, the interference between the incident infrared rays and the reflected infrared rays can be avoided, and infrared rays can efficiently enter bolometer membrane 8. As will be described later, since bolometer membranes 8 and second substrate 3 are formed in the same wafer process, the distance between bolometer membrane 8 and second substrate 3 in the Z direction can be precisely controlled. Therefore, the distance between reflection film 21 that is stacked on bolometer membrane 8 and second substrate 3 can also be precisely controlled in a similar manner.

Third Embodiment

Figure 6:
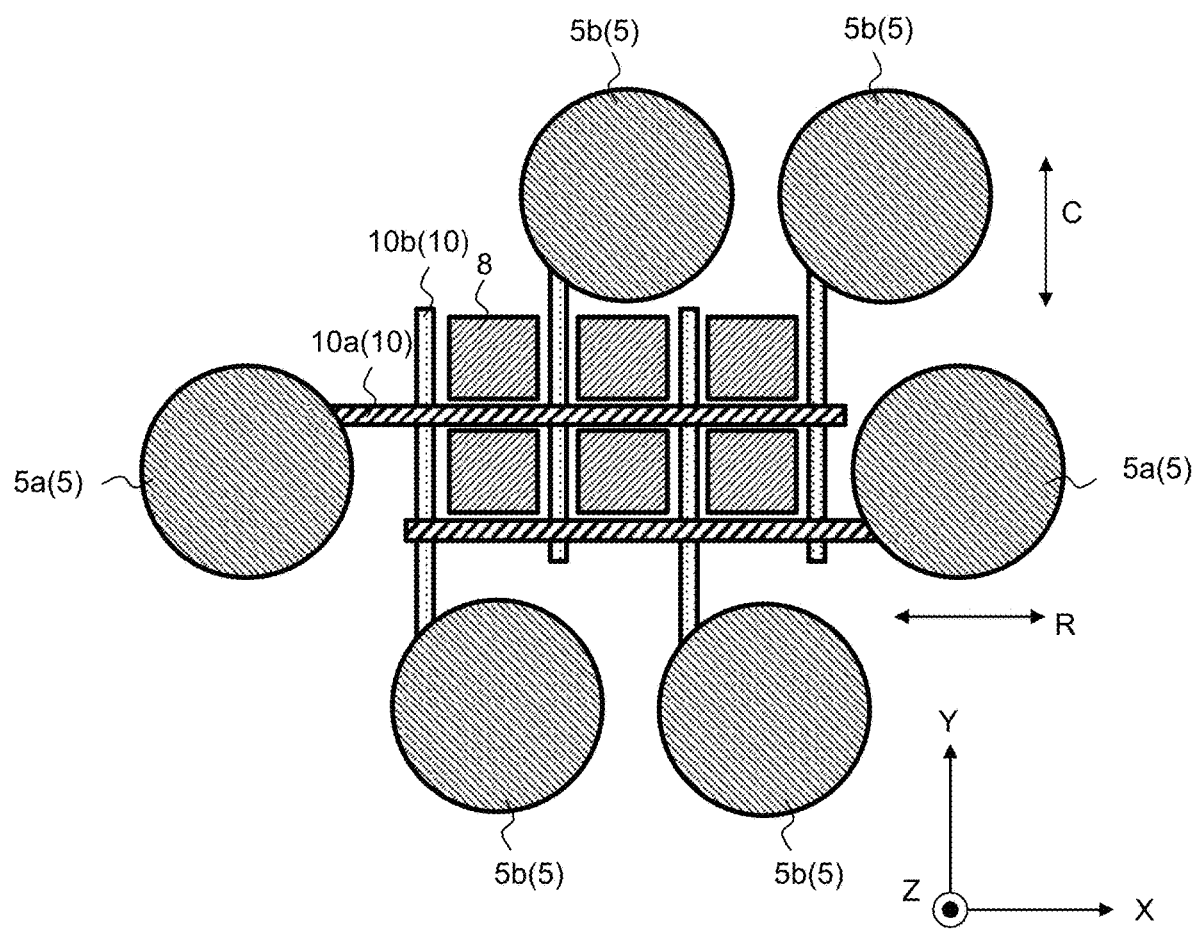
FIG. 6 is a schematic plan view of an infrared sensor of a third embodiment of the present invention.

FIG. 6 is a plan view similar to FIG. 2 showing infrared sensor 1 of the third embodiment of the present invention. Here, the difference from the first embodiment will be mainly described. Configurations and effects that are not explained are the same as those of the first embodiment. Like the first embodiment, bolometer membranes 8 form an array that consists of rows R and columns C. In the present embodiment, a part of first row electric connection members 5a that are connected to rows R of row leads 10a, respectively, are positioned at one end of rows R, and the other first row electric connection members 5a are positioned at the other end of rows R. First row electric connection members 5a are alternately positioned at one end and at the other end of rows R. Similarly, a part of first column electric connection members 5b that are connected to columns C of row leads 10b, respectively, are positioned at one end of columns C, and the other first column electric connection members 5b are positioned at the other end of columns C. First column electric connection members 5b are alternately positioned at one end and at the other end of columns C. As described above, first electric connection member 5 has a larger cross section than second electric connection member 6. For this reason, there is possibility that first electric connection member 5 cannot ensure a sufficient cross section depending on the size of (the space between) bolometer membranes 8. Increasing the space between bolometer membranes 8 in order to ensure a sufficient cross section may lead to an increase in the size of infrared sensor 1. In the present embodiment, first electric connection members 5a (5b) are alternatively positioned both at one end and at the other end of rows R (columns C) of leads 10a (10b), and therefore, one first electric connection member 5a (5b) can be arranged in a region for two rows R (columns C). This substantially doubles the area for first electric connection member 5 to be arranged. Therefore, in the present embodiment, it is possible to limit an increase in the size of infrared sensor 1 while ensuring a sufficient cross section of first electric connection member 5.

Figure 7:
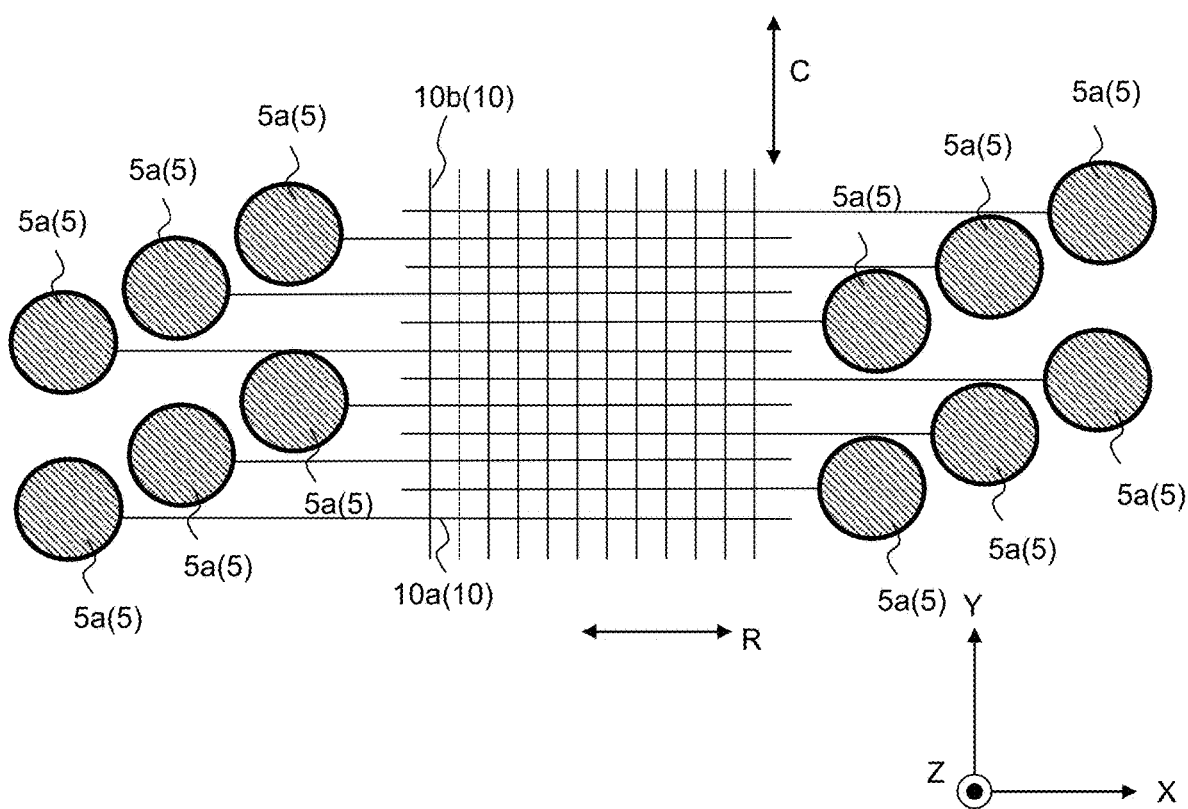
FIG. 7 is a schematic plan view of an infrared sensor of a modification of the third embodiment.

FIG. 7 is a schematic plan view of infrared sensor 1 of a modification of the present embodiment. Either first row electric connection members 5a positioned at one end of rows R of row leads 10a or first row electric connection members 5a positioned at the other end of rows R, preferably both, are shifted from each other in the first direction X. Similarly, although not shown, at least either first column electric connection members 5b positioned at one end of columns C of row leads 10b or first column electric connection members 5b positioned at the other end of columns C, preferably both, are shifted from each other in the second direction Y. As compared to the arrangement of first electric connection members 5 shown in FIG. 6, the limitation on the shape of the cross section of first electric connection member 5 is further reduced, so that a sufficient cross section of first electric connection member 5 can be still more easily ensured.

Fourth Embodiment

Figure 8:
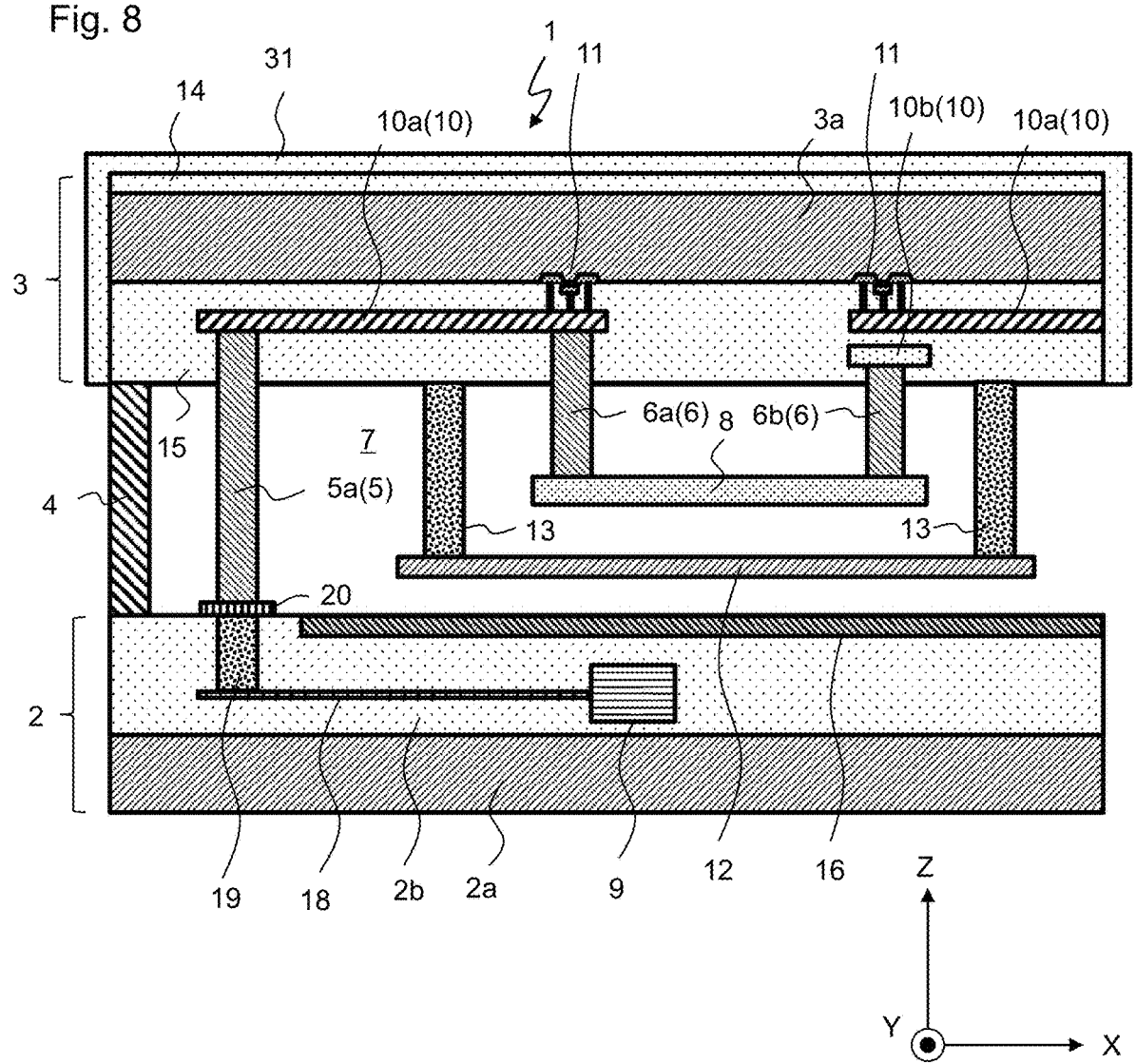
FIG. 8 is a schematic side view of an infrared sensor of a fourth embodiment of the present invention.

FIG. 8 is a schematic side view of infrared sensor 1 of the fourth embodiment of the present invention. Here, the difference from the first embodiment will be mainly described. Configurations and effects that are not explained are the same as those of the first embodiment. In the present embodiment, filter film 31 is formed on the outer surface of second substrate 3. Filter film 31 attenuates or shields a light having a wave length having a larger amount of energy than the energy bandgap of selective transistor 11. If second substrate 3 receives light in which the amount of energy is larger than the energy band gap of selective transistor 11, then selective transistor 11 that is formed in second substrate 3 may malfunction. Filter film 31 blocks such light or limits the passage of such light, so that selective transistor 11 is less likely to malfunction. Filter film 31 may also be formed on the sides of second substrate 3. Filter film 31 may be formed as a part of second substrate 3. Filter film 31 may be made of, for example, Ge, Si, chalcogenide, YF, ZnS, ZnSe and the like. Filter film 31 may also be formed as a part of first anti-reflective film 14.

Fifth Embodiment

Figure 9:
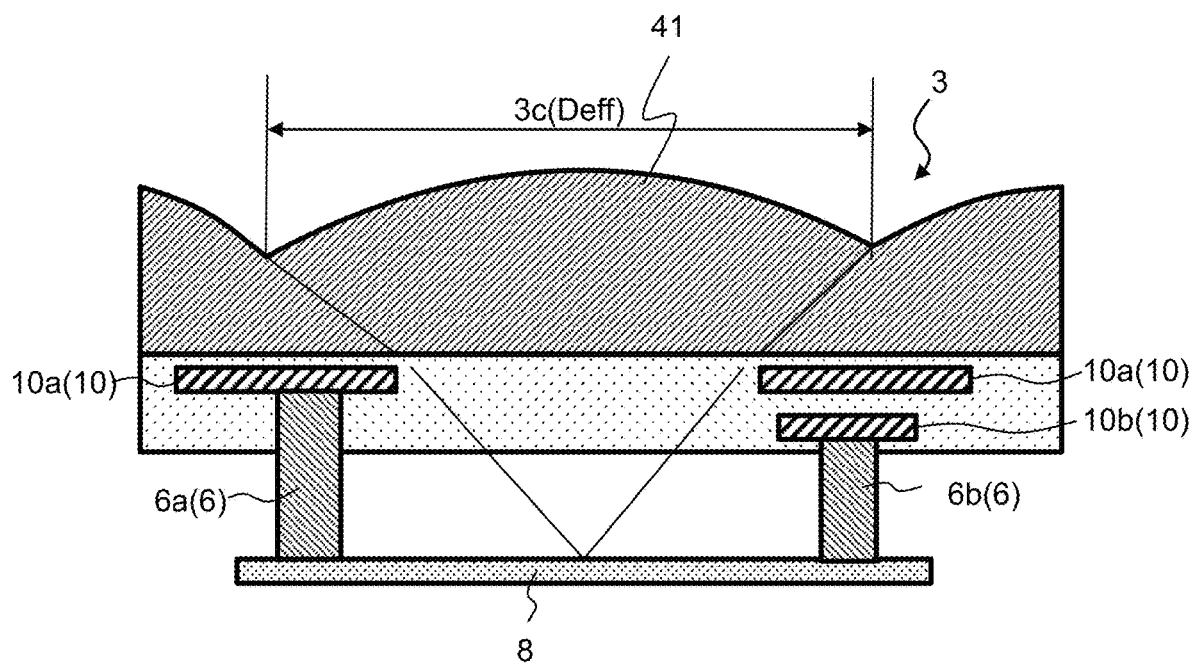
FIG. 9 is a schematic side view of an infrared sensor of a fifth embodiment of the present invention.

FIG. 9 is a schematic side view of infrared sensor 1 of the fifth embodiment of the present invention showing the vicinity of second substrate 3. Here, the difference from the first embodiment will be mainly described. Configurations and effects that are not explained are the same as those of the first embodiment. The outer surface of second substrate 3 has a micro lens arrangement in which first convex regions 41 are arranged in array. Each first convex region 41 is formed where first convex region 41 faces corresponding bolometer membrane 8. First convex region 41 is a minute convex lens, which increases effective aperture diameter Deff for each bolometer membrane 8 (compare to FIG. 1). When second substrate 3 is a flat plate, window region 3c is determined by the size of the region where no lead 10 (row lead 10a and column lead 10b) or no selective transistor 11 is present. In other words, the size of the light receiving portion of bolometer membrane 8 is limited by the space for arranging leads 10 and selective transistors 11. On the other hand, in the present embodiment, in which a micro lens arrangement is adopted in second substrate 3, infrared rays that are incident on a region that faces leads 10 or selective transistors 11, i.e., a region in which bolometer membrane 8 is not arranged, can also be received by bolometer membrane 8, and the efficiency of receiving infrared rays can be enhanced.

Figure 10:
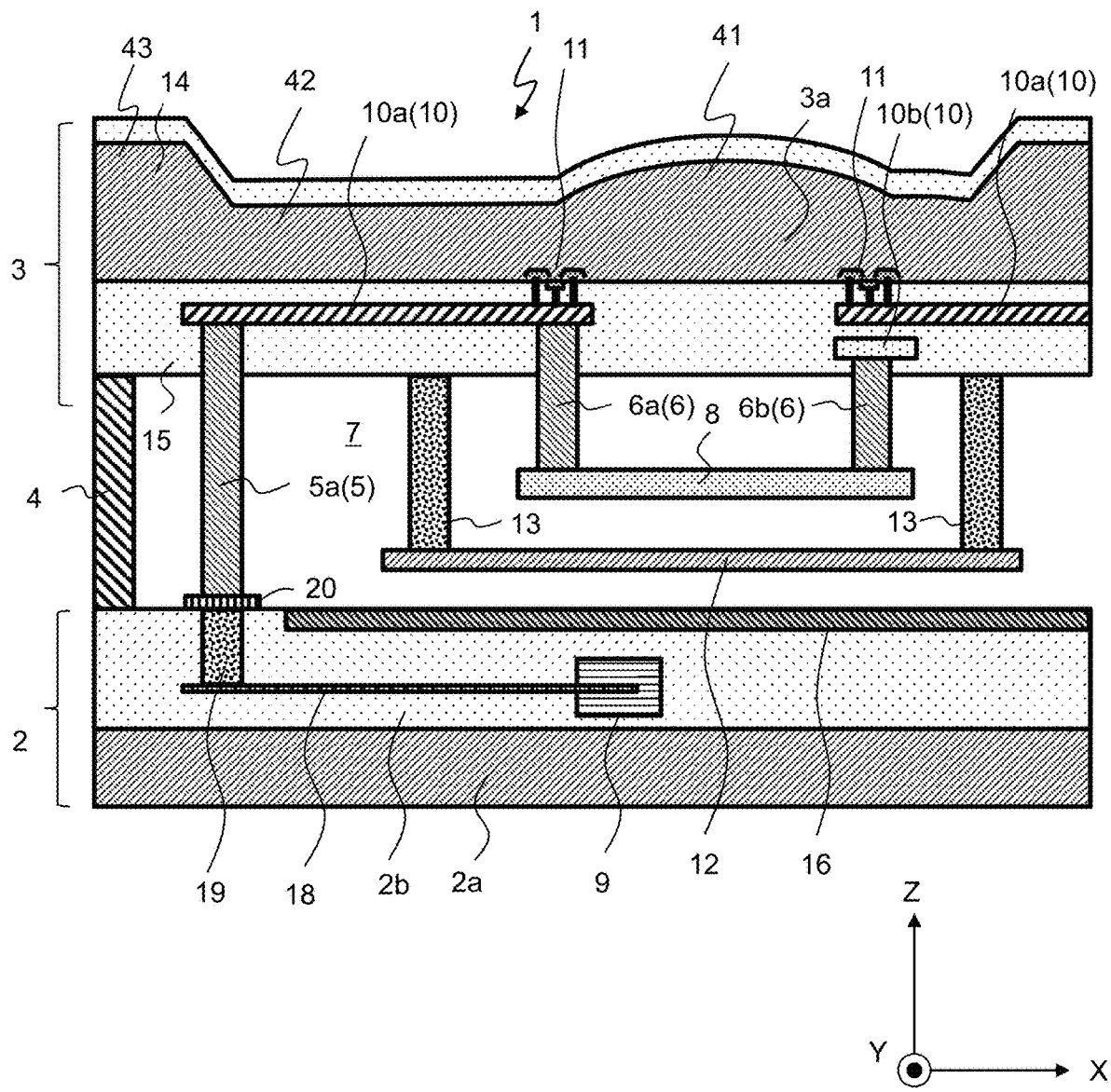
FIG. 10 is a schematic side view of an infrared sensor of a modification of the fifth embodiment.

FIG. 10 is a schematic side view of infrared sensor 1 showing a modification of the present embodiment. In the present modification, the outer surface of second substrate 3 has second convex region 43 that projects further outward than first convex region 41 that faces bolometer membrane 8. That is, the outer surface of second substrate 3 has first convex region 41 that faces bolometer membrane 8, flat region 42 having the same film thickness as the end of first convex region 41 and second convex region 43 having a larger film thickness than the top of first convex region 41, which are repeatedly arranged in first direction X and in second direction Y in this order. As will be described later, infrared sensor 1 is manufactured by manufacturing first substrate 2 and second substrate 3 separately, and then by adhering them to each other via side walls 4 and first electric connection members 5. When second substrate 3 is manufactured, a wafer is processed with the wafer surface where selective transistors 11 and leads 10 are formed facing upward, but the micro lens must be manufactured with the wafer surface where the micro lens is formed facing upward. For this reason, the micro lens is formed on the wafer first, and then the wafer is turned upside down, and the wafer surface, where the micro lens is formed, is held by a holder by suction, before leads 10 etc. are formed. At this time, only second convex regions 43 contact the holder in the present embodiment. Thus, first convex regions 41 are prevented from coming into contact with the holder, and are less likely to deteriorate or to be damaged.

Sixth Embodiment

Figure 11A:
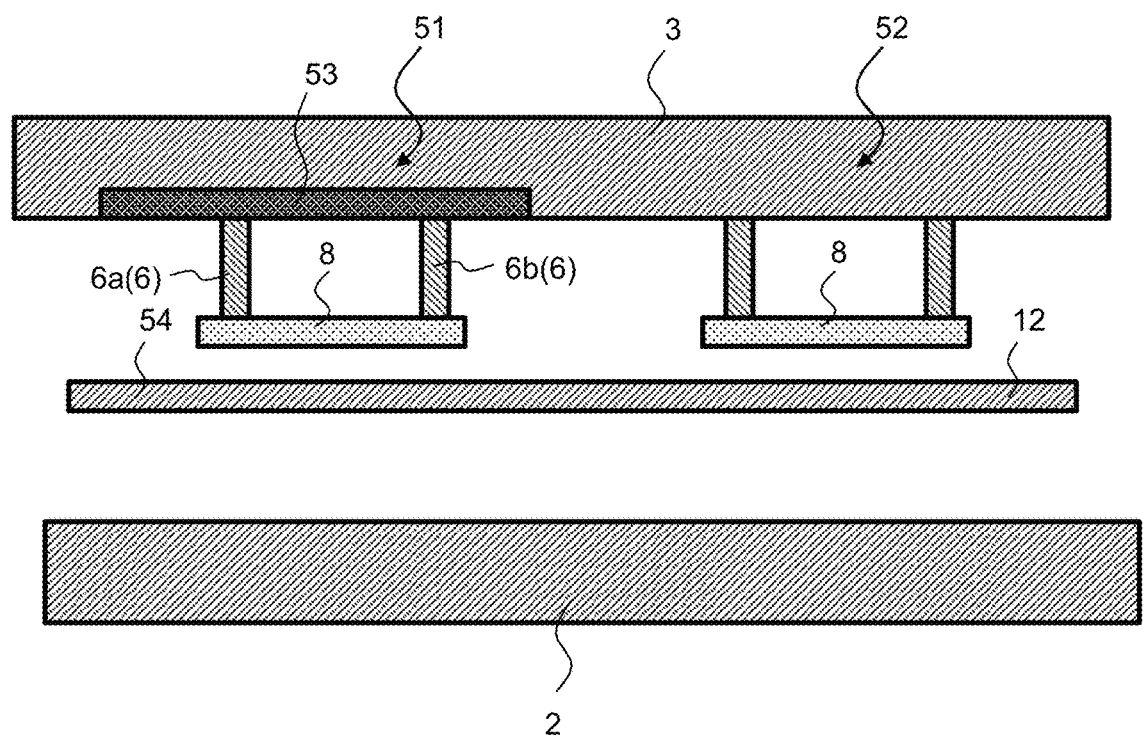
FIG. 11A is a schematic sectional view of an infrared sensor of a sixth embodiment of the present invention.
Figure 11B:
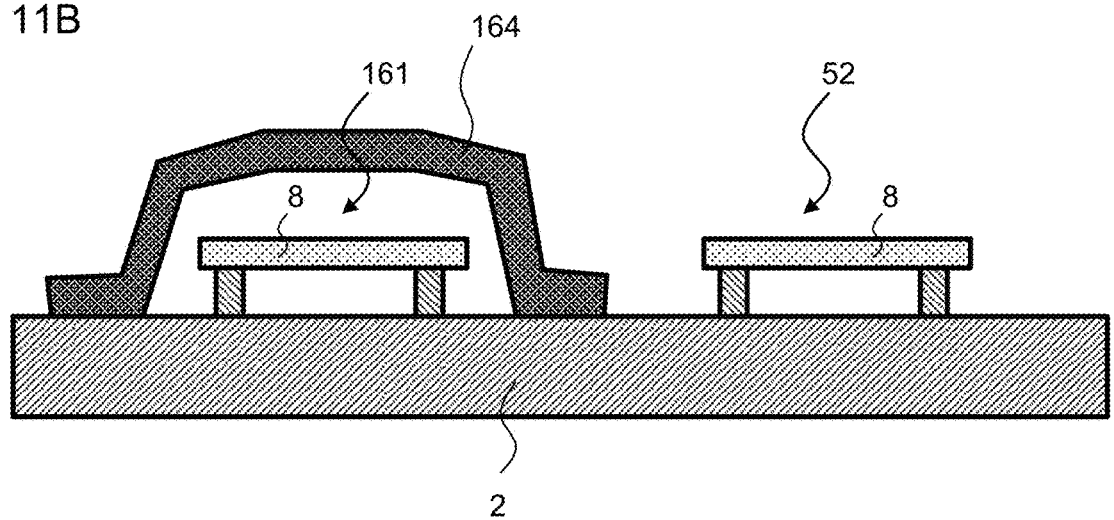
FIG. 11B is a schematic sectional view of an infrared sensor of a comparative example.

FIG. 11A is a schematic side view of infrared sensor 1 of the sixth embodiment of the present invention. Here, the difference from the first embodiment will be mainly described. Configurations and effects that are not explained are the same as those of the first embodiment. Infrared sensor 1 has blind cell 51 for temperature compensation of the output of bolometer membrane 8, which is active cell 52. Blind cell 51 has the same configuration as bolometer membrane 8, which is active cell 52, and is to supported by second substrate 3 in the same manner as active cell 52. Blind cell 51 receives radiation from the surrounding structures, such as first substrate 2 and second substrate 3, in the same manner as active cell 52, but does not receive the infrared radiation from outside. Therefore, blind cell 51 is used as a calibration cell that removes background noise that is generated by factors other than the infrared radiation from outside. For this reason, blind cell 51 needs to be configured so as not to receive the infrared radiation from outside. In the present embodiment, infrared shield 53 is formed in a region of second substrate 3 that faces blind cell 51. As shown in the comparative example in FIG. 11B, conventional blind cell 161 is covered with shield 164 that is formed on first substrate 2. However, such shield 164 requires complicated manufacturing processes and causes an increase in manufacturing cost. In the present embodiment, since infrared shield 53 can be easily produced in the process of manufacturing second substrate 3, the impact on the manufacturing cost can be limited.

Radiation shield 54 that limits radiation from first substrate 2 is provided between blind cell 51 and first substrate 2. Radiation shield 54 is integrated with radiation shield 12, but may be provided independent of radiation shield 12. By providing radiation shield 54, the impact of radiation from first substrate 2 in blind cell 51 can be made about the same level as that in active cell 52, and the function of blind cell 51 as a calibration cell can be enhanced.

Seventh Embodiment

Figure 12:
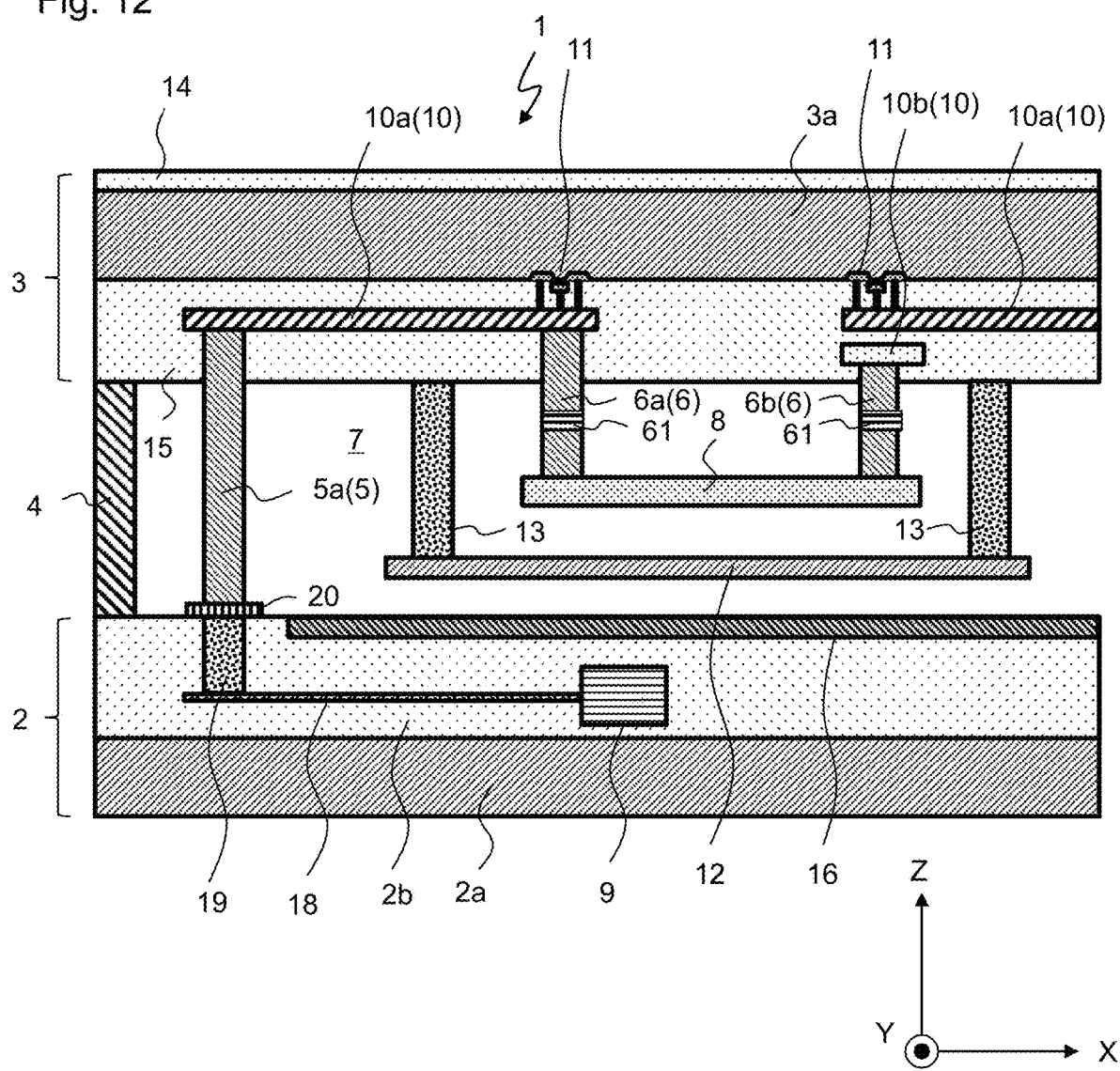
FIG. 12 is a schematic sectional view of an infrared sensor of a seventh embodiment of the present invention.

FIG. 12 is a schematic side view of infrared sensor 1 of the seventh embodiment of the present invention. Here, the difference from the first embodiment will be mainly described. Configurations and effects that are not explained are the same as those of the first embodiment. Second electric connection members 6 have capacitors 61. Specifically, capacitors 61 are inserted into second row electric connection member 6a and second column electric connection member 6b, so that second row electric connection member 6a and second column electric connection member 6b are divided in the Z direction. Second electric connection members 6a, 6b are made of a conductive material in order to provide a sense current. Therefore, they also have a higher thermal conductivity than insulating material, and may potentially transmit heat, that is transmitted through lead 10*a*, 10*b*, to bolometer membrane 8. In the present embodiment, since capacitor 61 blocks or limits heat conduction, the heat from lead 10*a*, 10*b* is less likely to be transmitted to bolometer membrane 8. In the present embodiment, since a sense current is supplied as an alternating current, the state of bolometer membrane 8 is outputted as a change in electric field. Capacitors 61 are provided both in second row electric connection member 6*a* and second column electric connection member 6*b*, but capacitor 61 may only be provided in one of them.

Method of Manufacturing Infrared Sensor 1

Figure 13:
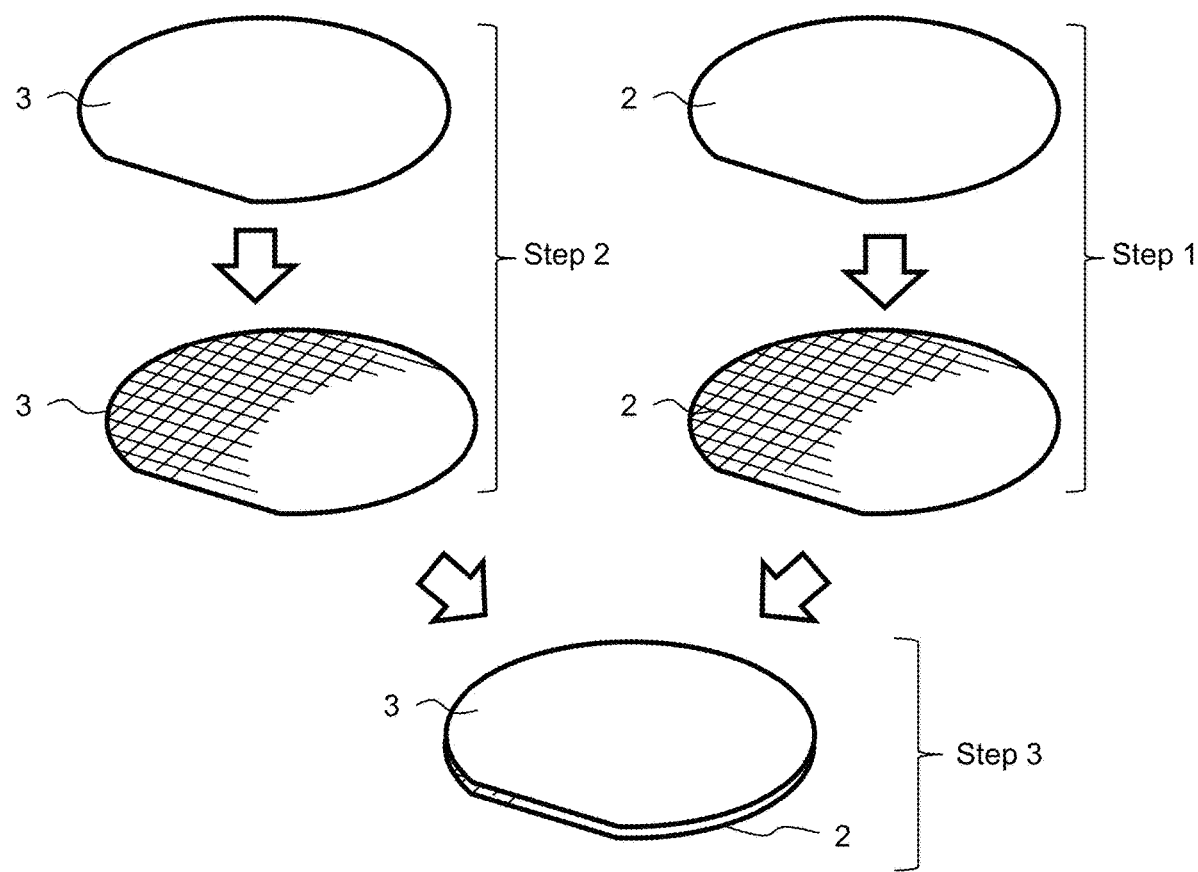
FIG. 13 is a diagram schematically illustrating an exemplary flow of a method for manufacturing an infrared sensor of the present invention.

Next, referring to FIGS. 13 and 14A-14J, an exemplary method of manufacturing infrared sensor 1 of the present invention will be shown. Since infrared sensor 1 is manufactured in the wafer processes, first substrate 2, second substrate 3 and silicon substrate 3*a* mean wafers as per the following description. FIG. 13 shows a schematic flow of a method of manufacturing infrared sensor 1. Infrared sensor 1 of the present invention is manufactured by step 1 of forming an ROIC etc. on first substrate 2, step 2 of forming bolometer membranes 8 etc. on second substrate 3, and step 3 of bonding first substrate 2 and second substrate 3 together. Step 3 is performed in a vacuum atmosphere. The manufacturing process of first substrate 2 does not need explanation and will not be described in details. Hereinafter, the step of forming bolometer membranes 8 etc. on second substrate 3 will be mainly described.

First, as shown in FIG. 14 A, selective transistors 11 are formed on silicon substrate 3*a*. Insulating layer 91 is formed on the sides of selective transistors 11.

Figure 14A:
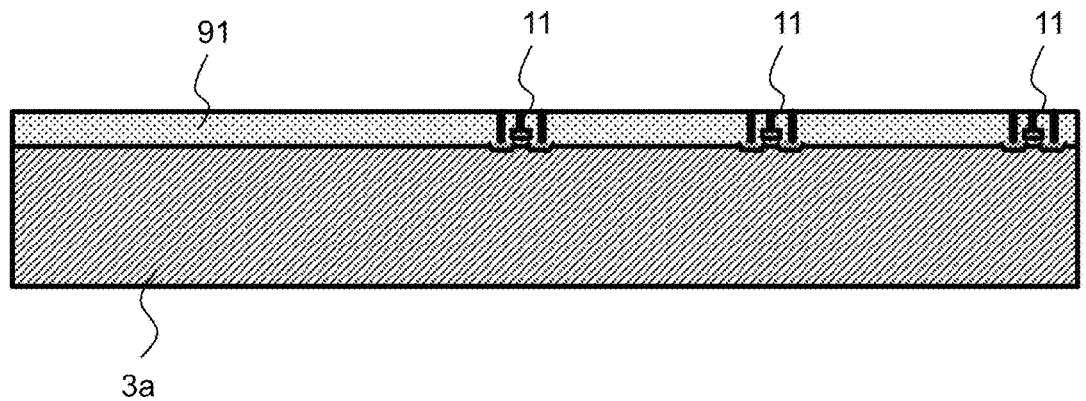
FIGS. 14A to 14J are views illustrating exemplary steps of a method for manufacturing an infrared sensor of the present invention.
Figure 14B:
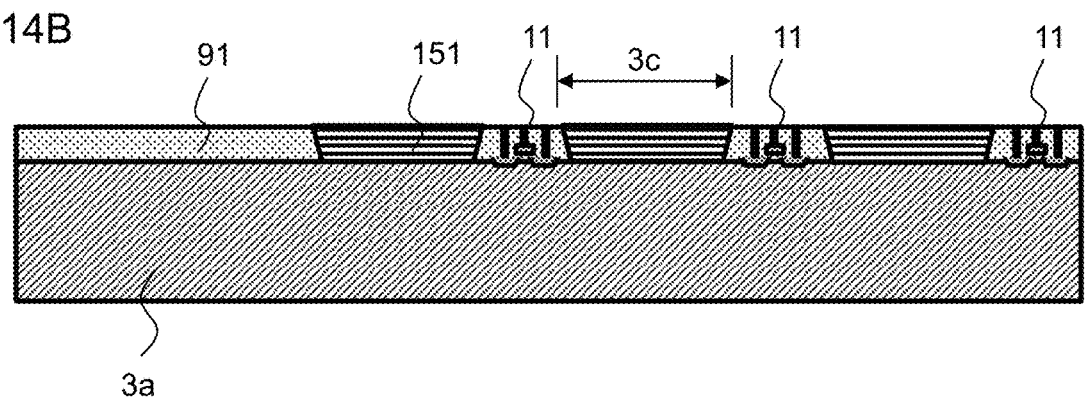
Figure 14C:
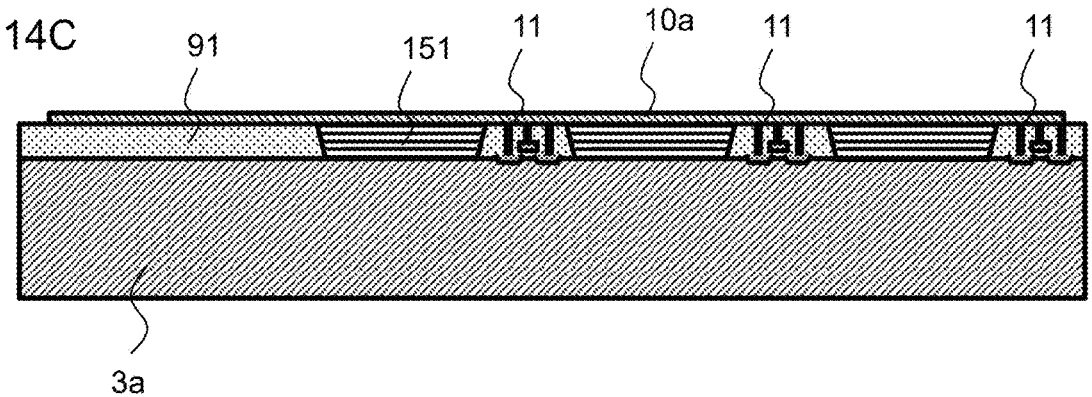

Next, as shown in FIG. 14B, insulating film 151, which is a part of second anti-reflective film 15, is formed in the regions of silicon substrate 3*a* laterally adjacent to selective transistors 11. Specifically, by means of a photo resist process and a milling process, openings are formed in the regions of insulating layers 91 that are to become window regions 3*c*, and then insulating film 151 is formed in the openings by means of an arc deposition process.

Next, as shown in FIG. 14 C, row leads 10*a* are formed. Specifically, openings are formed in a resist by means of a photo resist process and a milling process, and then row leads 10*a* are formed in the openings by means of deposition, and the resist is removed.

Figure 14D:
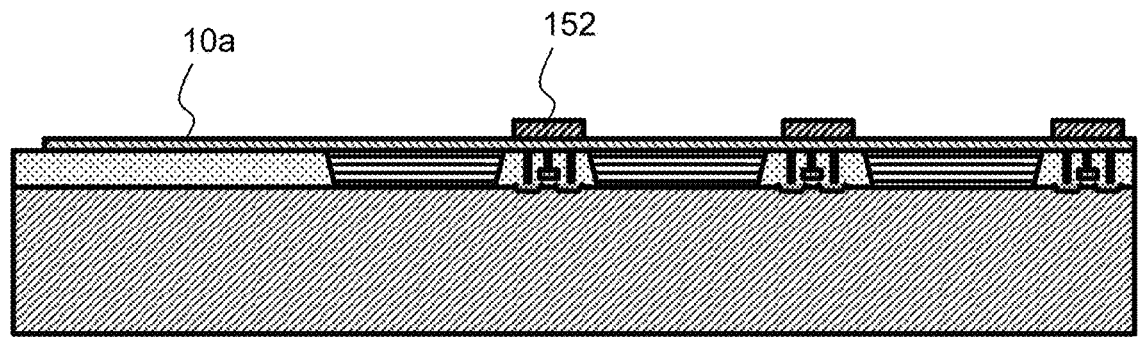
Figure 14E:
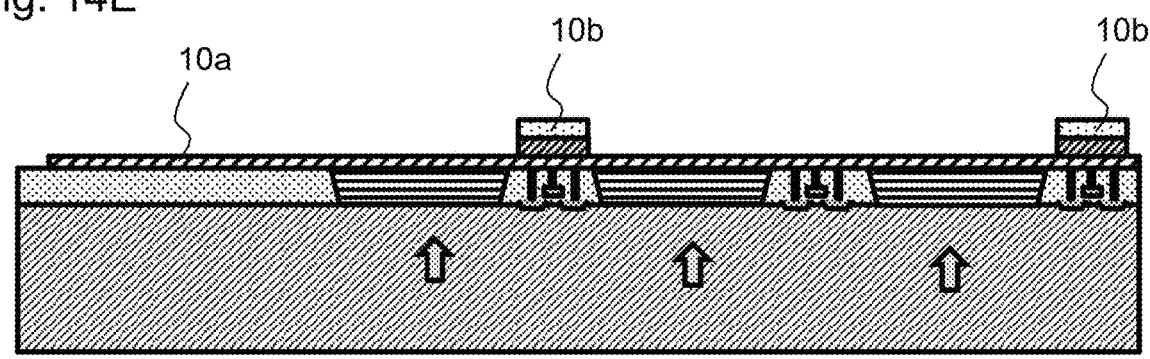

Next, as shown in FIG. 14D, insulating film 152, which is a part of second anti-reflective film 15, is formed above selective transistors 11. Specifically, openings are formed in a resist by means of a photo resist process and a milling process, and then insulating film 152 is formed in the openings by means of deposition, and the resist is removed.

Next, as shown in FIG. 14 E, column leads 10*b* are formed above insulating film 152. Specifically, openings are formed in a resist by means of a photo resist process and a milling process, and then column leads 10*b* are formed in the openings by means of deposition, and the resist is removed.

Figure 14F:
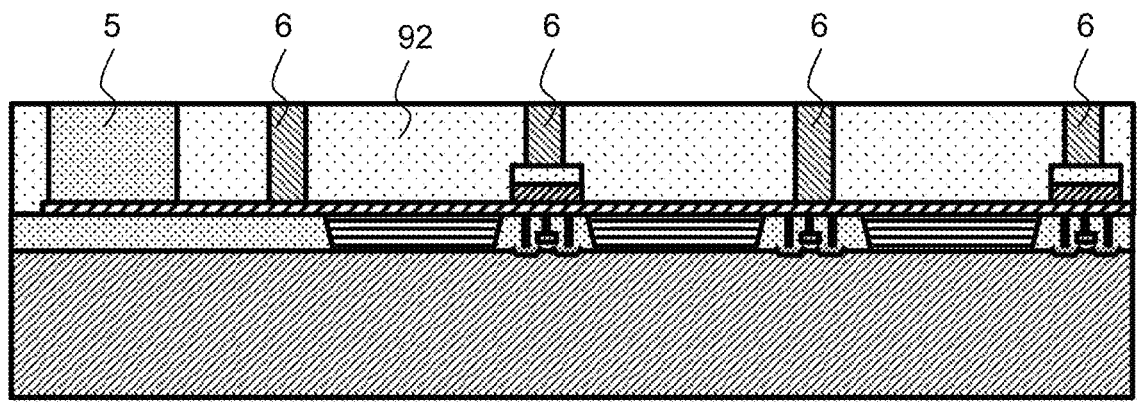

Next, as shown in FIG. 14F, the lower parts of first electric connection members 5 and second electric connection members 6 are formed. Specifically, first sacrifice layer 92 is formed, then openings are formed in first sacrifice layer 92 by means of a photo resist process and a milling process, and the lower parts of first electric connection members 5 and second electric connection members 6 are formed by plating.

Figure 14G:
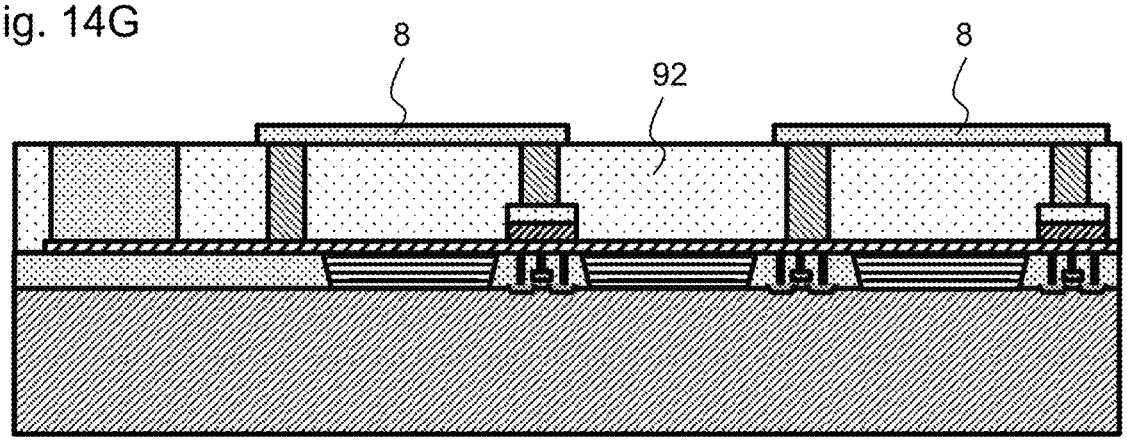

Next, as shown in FIG. 14G, bolometer membranes 8 is formed on second electric connection members 6 that are adjacent to each other. Specifically, bolometer membrane 8 is formed on second electric connection members 6 that are adjacent to each other, as well as on first sacrifice layer 92 therebetween, to electrically connect bolometer membrane 8 to second electric connection members 6 that are adjacent to each other.

Figure 14H:
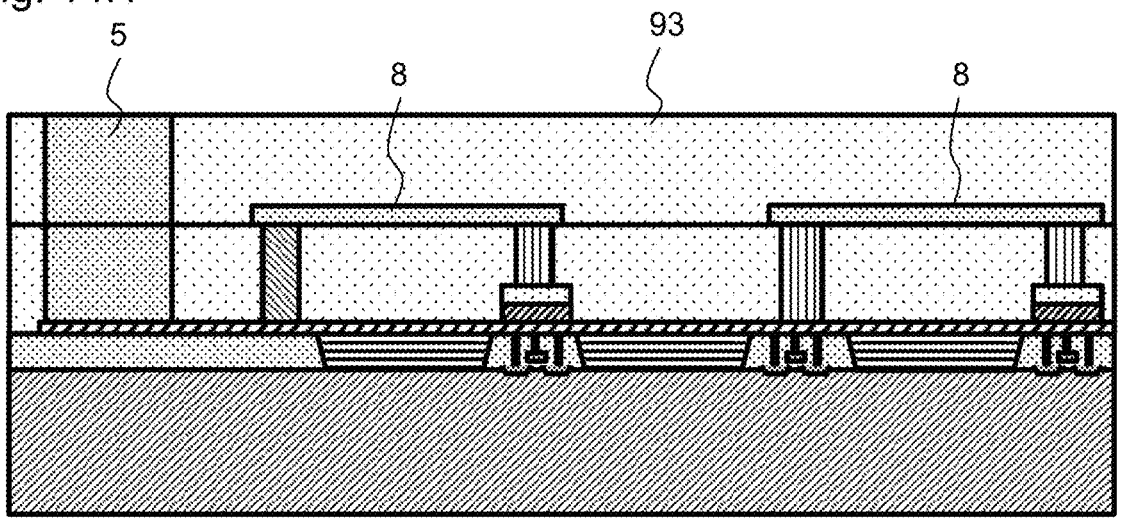

Next, as shown in FIG. 14H, second sacrifice layer 93 is formed, then openings are formed in second sacrifice layer 93 by means of a photo resist process and a milling process, and the upper parts of first electric connection members 5 are formed by plating.

Figure 14I:
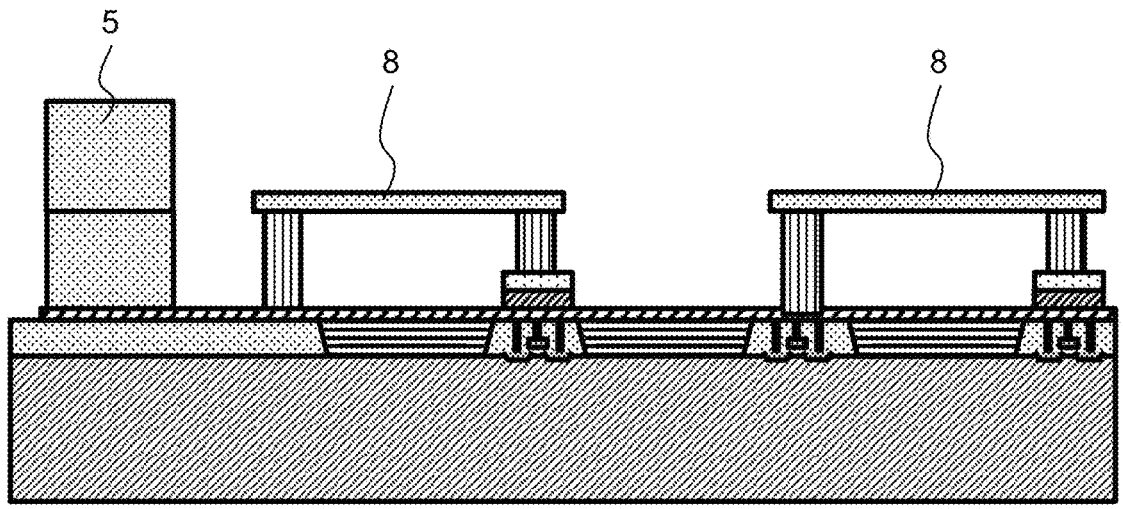

Next, as shown in FIG. 14I, first and second sacrifice layers 92, 93 are removed by ashing.

Figure 14J:
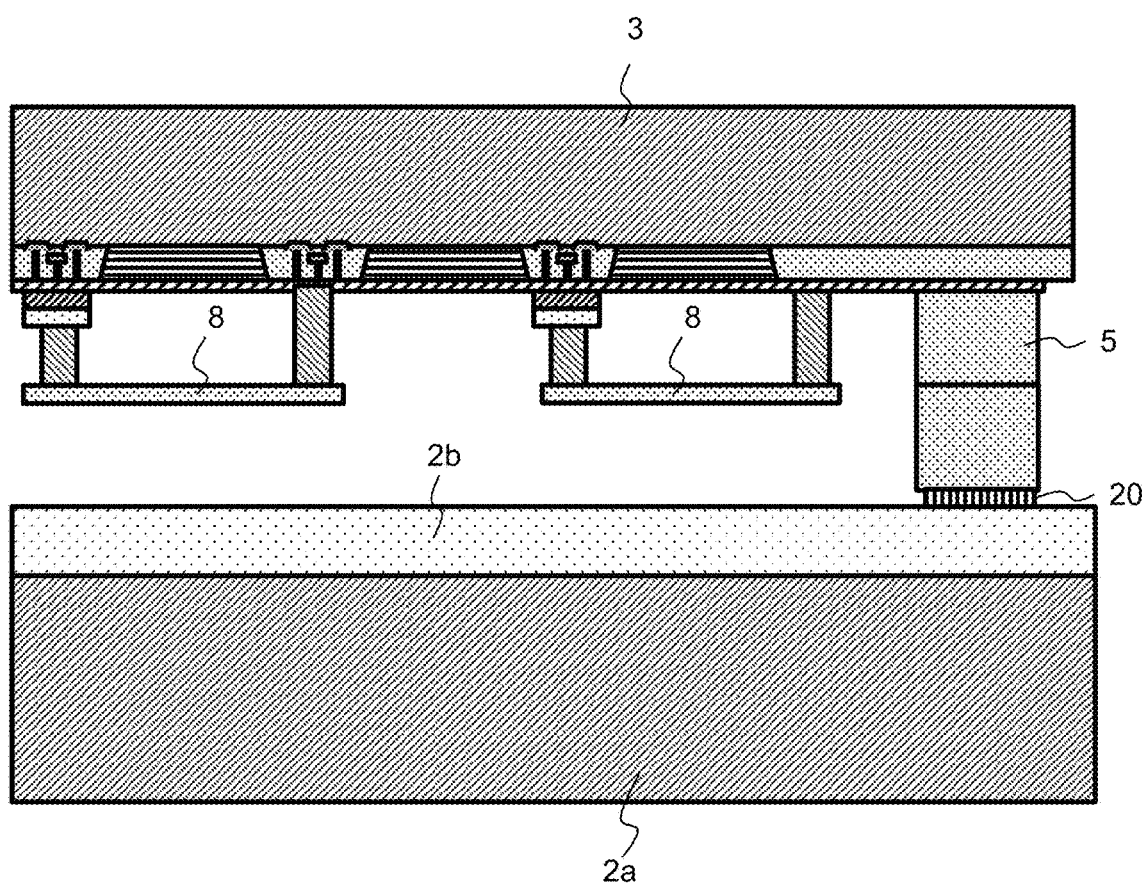

Next, as shown in FIG. 14J, second substrate 3 is turned upside down and is bonded to first substrate 2. The lower ends of first electric connection members 5 are bonded to pads 20 that are connected to an ROIC etc. Although not shown, both first substrate 2 and second substrate 3 are bonded to side walls 4, so as to form inner space 7 between first substrate 2 and second substrate 3.

Although certain preferred embodiments of the present invention have been shown and described in detail, it should be understood that various changes and modifications may be made without departing from the spirit or scope of the appended claims.

What is claimed is:

1. An electromagnetic wave sensor comprising: a first substrate, a second substrate that faces the first substrate so as to form an inner space between the first substrate and the second substrate, wherein the second substrate transmits infrared rays; a plurality of bolometer membranes that is provided in the inner space and that is supported by the second substrate; a local heat source that is formed in the first substrate; a first electric connection member that connects the first substrate to the second substrate; and a lead that extends on or in the second substrate and that connects the first electric connection member to the bolometer membranes.

2. The electromagnetic wave sensor according to claim 1, further comprising a second electric connection member that extends from the second substrate towards the first substrate, and the bolometer membrane is supported by the second electric connection member with a space from the second substrate.

3. The electromagnetic wave sensor according to claim 2, wherein the second electric connection member includes a capacitor.

4. The electromagnetic wave sensor according to claim 1, further comprising a plurality of selective transistors that are formed in the second substrate, wherein the selective transistor selects one bolometer membrane from among a plurality of the bolometer membranes.

5. The electromagnetic wave sensor according to claim 4, wherein the selective transistors are arranged such that the selective transistors avoid a region of the second substrate where the second substrate faces the bolometer membrane.

6. The electromagnetic wave sensor according to claim 4, further comprising a filter film that is formed on an outer surface of the second substrate, wherein the filter film attenuates light having a larger amount of energy than energy band gap of the selective transistor.

7. The electromagnetic wave sensor according to claim 1, wherein the bolometer membranes are arranged in rows at a constant interval at least in a first direction, and the first electric connection members are positioned at one end or the other end of the rows of the bolometer membranes, wherein a length of the lead that connects the first electric connection member to the bolometer membrane closest to the first electric connection member is larger than the interval.

8. The electromagnetic wave sensor according to claim 7, wherein a plurality of the bolometer membranes forms an array, wherein the array consists of the rows and columns of the bolometer membranes, the bolometer membranes being arranged along the columns at a constant interval in a second direction that intersects the first direction, wherein a part of the first electric connection members are alternately positioned at one end and the other end of the rows, and the remaining first electric connection members are alternately positioned at one end and the other end of the columns.

9. The electromagnetic wave sensor according to claim 8, wherein at least either the first electric connection members that are positioned at the one end of the rows or the first electric connection members that are positioned at the other end of the rows are shifted from each other in the first direction.

10. The electromagnetic wave sensor according to claim 8, wherein at least either the first electric connection members that are positioned at the one end of the columns or the first electric connection members that are positioned at the other end of the columns are shifted from each other in the second direction.

11. The electromagnetic wave sensor according to claim 1, further comprising a first radiation shield that is positioned between the bolometer membrane and the first substrate, wherein the first radiation shield attenuates radiation from the first substrate.

12. The electromagnetic wave sensor according to claim 11, further comprising support members that extend from the second substrate towards the first substrate, wherein the first radiation shield is supported by the support members.

13. The electromagnetic wave sensor according to claim 11, wherein a surface of the first radiation shield that faces the bolometer membrane has a reflective surface that reflects infrared rays, and space between the reflective surface and the bolometer membrane is 2 to 3.5 µm.

14. The electromagnetic wave sensor according to claim 1, further comprising a getter film that is positioned in the inner space.

15. The electromagnetic wave sensor according to claim 1, further comprising a first anti-reflective film that forms at least a part of an outer surface of the second substrate.

16. The electromagnetic wave sensor according to claim 1, further comprising a second anti-reflective film that forms at least a part of an inner surface of the second substrate.

17. The electromagnetic wave sensor according to claim 16, wherein the second anti-reflective film is a laminated film that consist of a plurality of insulating films, and the lead is positioned inside the laminated film.

18. The electromagnetic wave sensor according to claim 1, wherein a first convex region is formed in a region of an outer surface of the second substrate that faces the bolometer membrane.

19. The electromagnetic wave sensor according to claim 18, wherein a second convex region that protrudes further outward than the first convex region is formed in a region of the outer surface of the second substrate that does not face the bolometer membrane.

20. The electromagnetic wave sensor according to claim 1, further comprising:
a blind cell for temperature compensation of output of the bolometer membrane; and
a radiation shield that is formed in a region of the second substrate that faces the blind cell.

21. The electromagnetic wave sensor according to claim 20, wherein a second radiation shield is disposed between the blind cell and the first substrate, wherein the second radiation shield limits radiation from the first substrate.

22. The electromagnetic wave sensor according to claim 1, further comprising a heat diffusing plate that is formed in a region of the first substrate that faces the bolometer membranes, wherein the heat diffusing plate has a higher thermal conductivity than the first substrate.

* * * * *